(12) United States Patent
Yamamoto et al.

(10) Patent No.: US 12,476,118 B2
(45) Date of Patent: Nov. 18, 2025

(54) SUBSTRATE TREATING APPARATUS AND SUBSTRATE TREATING METHOD

(71) Applicant: SCREEN Holdings Co., Ltd., Kyoto (JP)

(72) Inventors: Shigeru Yamamoto, Kyoto (JP); Takashi Akiyama, Kyoto (JP); Daiki Fujii, Kyoto (JP); Kenji Edamitsu, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 4 days.

(21) Appl. No.: 18/328,057

(22) Filed: Jun. 2, 2023

(65) Prior Publication Data
US 2023/0390809 A1    Dec. 7, 2023

(30) Foreign Application Priority Data
Jun. 3, 2022   (JP) .................................. 2022-090876

(51) Int. Cl.
*H01L 21/677*  (2006.01)
*B08B 3/10*  (2006.01)
(Continued)

(52) U.S. Cl.
CPC .......... *H01L 21/67034* (2013.01); *B08B 3/10* (2013.01); *B08B 9/08* (2013.01);
(Continued)

(58) Field of Classification Search
CPC ........... H01L 21/00–86; B08B 9/08–46; B08B 3/108
See application file for complete search history.

(56) References Cited

U.S. PATENT DOCUMENTS

| 5,651,836 A | * | 7/1997 | Suzuki | H01L 21/02052 |
| | | | | 257/E21.228 |
| 6,405,452 B1 | * | 6/2002 | Twu | H01L 21/67034 |
| | | | | 34/443 |

(Continued)

FOREIGN PATENT DOCUMENTS

| CN | 101399182 B | 4/2012 |
| EP | 0792699 A2 * | 9/1997 |

(Continued)

OTHER PUBLICATIONS

Office Action dated May 28, 2024 for corresponding Japanese Patent Application No. 2022-090876.

(Continued)

*Primary Examiner* — Kaj K Olsen
*Assistant Examiner* — Richard Z. Zhang
(74) *Attorney, Agent, or Firm* — OSTROLENK FABER LLP

(57) ABSTRACT

A substrate treating apparatus includes a process tank for storing a treatment liquid, a chamber for surrounding the process tank, a solvent vapor nozzle for supplying solvent vapor into the chamber, a cleaning liquid nozzle for supplying a cleaning liquid, and a controller. The controller causes immersion treatment, where a substrate is immersed in the treatment liquid stored in the process tank, to be performed for a preset period of time, and causes dry treatment, where the substrate processed with the treatment liquid and taken out of the process tank is dried with the solvent vapor supplied from the solvent vapor nozzle, to be performed. The controller causes the cleaning liquid nozzle to supply the cleaning liquid into the chamber and causes the process tank to be immersed in the cleaning liquid stored in the chamber, whereby the chamber cleaning treatment, (Continued)

where the chamber including an outer wall of the process tank is cleaned, is performed.

10 Claims, 12 Drawing Sheets

(51) Int. Cl.
    *B08B 9/08*       (2006.01)
    *B08B 9/093*     (2006.01)
    *H01L 21/02*     (2006.01)
    *H01L 21/67*     (2006.01)

(52) U.S. Cl.
    CPC ........ *B08B 9/093* (2013.01); *H01L 21/67057* (2013.01); *B08B 9/0933* (2013.01); *H01L 21/02052* (2013.01); *H01L 21/02057* (2013.01); *H01L 21/67757* (2013.01)

(56) References Cited

U.S. PATENT DOCUMENTS

| | | | |
|---|---|---|---|
| 2002/0061647 A1 | 5/2002 | Kawamoto | 438/689 |
| 2005/0121142 A1 | 6/2005 | Nakao et al. | 156/345.29 |
| 2005/0178409 A1* | 8/2005 | Masaki | H01L 21/67057 |
| | | | 134/76 |
| 2007/0295375 A1 | 12/2007 | Aihara | |
| 2009/0084405 A1 | 4/2009 | Kimura et al. | 134/18 |
| 2018/0090343 A1* | 3/2018 | Yamaguchi | H01L 21/67739 |
| 2020/0168484 A1 | 5/2020 | Chen et al. | |
| 2020/0211865 A1 | 7/2020 | Otsu et al. | |

FOREIGN PATENT DOCUMENTS

| | | | |
|---|---|---|---|
| JP | H10-189527 A | | 7/1998 |
| JP | 2000-012495 A | | 1/2000 |
| JP | 2004-063739 A | | 2/2004 |
| JP | 2005-123315 A | | 5/2005 |
| JP | 2008-004874 A | | 1/2008 |
| JP | 2008-198689 A | | 8/2008 |
| JP | 2008-251779 A | | 10/2008 |
| JP | 2010-093097 A | | 4/2010 |
| JP | 2012-186311 A | | 9/2012 |
| JP | 2015070148 A | * | 4/2015 |
| JP | 2018-056155 A | | 4/2018 |
| JP | 2020-107744 A | | 7/2020 |

OTHER PUBLICATIONS

Office Action dated Apr. 22, 2025 for corresponding Taiwanese Patent Application No. 112119750.

* cited by examiner

SUBSTRATE TREATING APPARATUS AND SUBSTRATE TREATING METHOD

CROSS-REFERENCE TO RELATED APPLICATIONS

This application claims priority to Japanese Patent Application No. 2022-090876 filed Jun. 3, 2022, the subject matter of which is incorporated herein by reference in entirety.

TECHNICAL FIELD

The present invention relates to a substrate treating apparatus and a substrate treating method for treating substrates. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

BACKGROUND ART

A substrate treating apparatus includes a process tank for storing a treatment liquid like pure water, a chamber configured to surround the process tank, a lifter for holding a substrate, a nitrogen nozzle for supplying nitrogen gas into the chamber, a solvent nozzle for supplying isopropyl alcohol (IPA) vapor into the chamber, and an air pump for exhausting gas from the chamber for decompression (see, for example, Japanese Unexamined Patent Publication No. 2015-070148A).

The substrate treating apparatus operates in such a manner as under, (see, for example, Japanese Unexamined Patent Publication No. 2015-070148A). The lifter immerses a substrate in a treatment liquid within the process tank. Then, the solvent nozzle supplies IPA vapor, whereby an IPA vapor atmosphere is obtained within the chamber. Thereafter, the lifter takes the substrate out of the treatment liquid within the process tank, and moves the substrate to a drying position within the chamber. Thereafter, the air pump decompresses the chamber. This achieves active volatilization of IPA and the like adhered to the substrate to perform dry treatment on the substrate. Thereafter, the air pump stops, and the nitrogen nozzle supplies nitrogen gas, whereby pressure in the chamber returns to an atmospheric pressure.

Japanese Unexamined Patent Publication No. 2008-251779A discloses a neutralizing and cleaning device of a substrate treating apparatus. The neutralizing and cleaning device includes a chemical tank for storing "acid chemicals" or "alkaline chemicals", and a chamber for accommodating the chemical tank. The neutralizing and cleaning device includes a pure water nozzle, a circulating nozzle, and a circulating pipe. The circulating pipe is connected to the circulating nozzle. The pure water nozzle and the circulating nozzle are each located toward between an inner wall of the chamber and an outer wall of the chemical tank. The neutralizing and cleaning device stores pure water in the chamber through the pure water nozzle, and circulates the pure water, stored in the chamber, via the circulating pipe. This causes release of chemical components, adhered to the outer wall of the chemical tank, from an adhesion surface by flow of the pure water.

Japanese Unexamined Patent Publication No. 2010-093097A discloses a feature that condensation of dilute hydrochloric acid vapor is washed away and removed by supplying pure water into a chamber with a hand shower.

Japanese Unexamined Patent Publication No. 2018-056155A discloses a process of performing a hydrophobic treatment on a surface of a substrate. Moreover, Japanese Unexamined Patent Publication No. 2008-004874A discloses a substrate treating apparatus that achieves exhaust of a treatment liquid from a chamber even under a decompressed solvent atmosphere.

SUMMARY OF INVENTION

Technical Problem

However, the currently-used substrate treating apparatus possess the following drawback. Using the apparatus causes particles to accumulate on and contaminate a lower part of the chamber (including the outer wall of the process tank). If the lower part of the chamber is contaminated, a drawback occurs that nitrogen gas swirls (raises) the particles on the lower part of the chamber while being supplied, and the particles adhere to the substrate.

The present invention has been made regarding the state of the art noted above, and its one object is to provide a substrate treating apparatus and a substrate treating method capable of preventing adhesion of particles to a substrate.

Solution to Problem

The present invention is constituted as stated below to achieve the above object. One aspect of the present invention provides a substrate treating apparatus including a process tank configured to store a treatment liquid, a chamber configured to surround the process tank, a solvent vapor nozzle configured to supply solvent vapor into the chamber, a cleaning liquid nozzle configured to supply a cleaning liquid into the chamber, and a controller. The controller causes immersion treatment, where a substrate is immersed in the treatment liquid stored in the process tank for a preset period of time, to be performed, and causes dry treatment, where the substrate processed with the treatment liquid and taken out of the process tank is dried with the solvent vapor supplied from the solvent vapor nozzle, to be performed The controller causes the cleaning liquid nozzle to supply the cleaning liquid into the chamber and causes the process tank to be immersed in the cleaning liquid stored in the chamber, thereby causing chamber cleaning treatment, where the chamber including an outer wall of the process tank is cleaned, to be performed.

With the substrate treating apparatus according to the aspect of the present invention, the cleaning liquid nozzle supplies the cleaning liquid into the chamber and the process tank is immersed in the cleaning liquid stored in the chamber, thereby performing the chamber cleaning treatment where the chamber including the outer wall of the process tank is cleaned. This achieves cleaning off of particles adhered not only to the outer wall of the process tank but also to a side wall and a bottom wall of the chamber. Accordingly, particles at a lower part of the chamber can be prevented from swirling and adhering to the substrate.

Moreover, it is preferred in the substrate treating apparatus described above that the controller causes the chamber cleaning treatment to be performed after the immersion treatment, and causes the dry treatment to be performed after the chamber cleaning treatment. This achieves cleaning treatment within the chamber midstream of a sequence of substrate treatment.

Moreover, it is preferred that the substrate treating apparatus described above further includes a water-repellent vapor nozzle configured to supply water-repellent vapor into the chamber, and that the controller causes water-repellent vapor supply treatment, where the water-repellent vapor is supplied through the water-repellent vapor nozzle into the chamber for making the substrate water-repellent, to be performed after the immersion treatment and causes the chamber cleaning treatment to be performed after the water-repellent vapor supply treatment.

The water-repellent vapor supply treatment for making the substrate water-repellent generates many particles derived from the water repellent. The particles accumulate at the lower part of the chamber. Then, the particles at the lower part of the chamber swirl and adhere to the substrate. Such a drawback is present. The aspect of the present invention achieves cleaning treatment within the chamber midstream of a sequence of substrate treatment. Accordingly, the particles (including particles derived from the water repellent) at the lower part of the chamber can be prevented from swirling up and adhering to the substrate.

Moreover, it is preferred that the substrate treating apparatus described above further includes an air pump configured to exhaust gas from the chamber, the cleaning liquid nozzle is located at a lower part of the chamber and supplies the cleaning liquid into the chamber, and the controller causes the chamber cleaning treatment to be performed in a state where the chamber is decompressed with the air pump.

This achieves cleaning treatment within the chamber in a state where the chamber is decompressed with the air pump. Moreover, such a case is assumed where the cleaning liquid is supplied to the process tank to flow out of the process tank and to be stored in the chamber. In a state where the chamber is decompressed, mist is likely to be generated from the cleaning liquid stored in the process tank and the generated mist is likely to adhere to the substrate. Such a drawback is present. In addition, the adhered mist may adversely affect the substrate. With the aspect according to the present invention, since the cleaning liquid nozzle provided at the lower part of the chamber can directly supply the cleaning liquid into the chamber, the substrate can be separated from the cleaning liquid. This can suppress adhesion of the generated mist to the substrate.

Moreover, it is preferred in the substrate treating apparatus described above that the air pump is configured to exhaust gas within the chamber via an exhaust port provided in a side wall of the chamber laterally of the process tank, and that the controller causes the chamber cleaning treatment to be performed in a state where the chamber is decompressed while gas is exhausted from the chamber with the air pump. Even if mist is generated from the cleaning liquid, the air pump can exhaust the mist from the exhaust port.

Moreover, it is preferred that the substrate treating apparatus described above further includes a shield plate provided between an outer wall of the process tank and an inner wall of the chamber for shielding an atmosphere between an upper part of the chamber and the lower part of the chamber, and that the shield plate has an opening through which part of a treatment liquid, flowing out of the process tank, passes to the lower part of the chamber. Provision of the shield plate can suppress mist flow from the lower part to the upper part of the chamber even if mist is generated from the cleaning liquid stored in the chamber. This can also suppress flow of the swirled particles from the lower part to the upper part of the chamber.

Moreover, it is preferred in the substrate treating apparatus described above that the cleaning liquid nozzle is located at a bottom of the chamber at a position overlapping the process tank in plan view. This allows the cleaning liquid nozzle to be hidden behind the process tank. Moreover, the cleaning liquid nozzle can be separated from the substrate at the upper part of the chamber, leading to prevention of the mist from adhering to the substrate even in generation of the mist.

Moreover, it is preferred in the substrate treating apparatus described above that the controller causes the chamber cleaning treatment to be performed when the solvent vapor nozzle supplies the solvent vapor into the chamber. The chamber cleaning treatment can be performed simultaneously with the supply of the solvent vapor into the chamber, achieving effective substrate treatment.

Moreover, it is preferred in the substrate treating apparatus described above that the controller causes exhaust treatment, where the cleaning liquid is exhausted from an outlet in the chamber, to be performed in a state where the chamber is decompressed with the air pump, and causes the chamber cleaning treatment and the exhaust treatment to be repeated at a preset number of times. The more times the chamber cleaning treatment is repeated, the more satisfactorily the chamber is cleaned.

Moreover, it is preferred that the substrate treating apparatus described above further includes an inert gas nozzle configured to supply inert gas into the chamber, and that the controller causes the inert gas nozzle to supply the inert gas into the chamber after the dry treatment to return pressure of the decompressed chamber to atmospheric pressure. Cleaning treatment within the chamber achieves reduction of particles swirled by the inert gas.

Moreover, it is preferred in the substrate treating apparatus described above that the cleaning liquid nozzle is located in a posture toward the outer wall of the process tank, and that the controller causes the cleaning liquid nozzle to supply the cleaning liquid into the chamber while the cleaning liquid hits the outer wall of the process tank in a state where the chamber is decompressed with the air pump.

Since the liquid flows relatively frequently on the bottom face of the chamber, particles are relatively unlikely to accumulate on the bottom face of the chamber. On the other hand, since the outer wall of the process tank, for example, is part where the liquid does not flow easily even if suspended particles adhere thereto, the particles accumulate. Then, the cleaning liquid is stored in the chamber while hitting the part, leading to easy removal of the particles adhered to the outer wall of the process tank.

Moreover, it is preferred that the substrate treating apparatus described above further includes a nozzle cover provided at the bottom in the chamber to face an upward ejection port of the cleaning liquid nozzle, and that the nozzle cover includes a ceiling wall, and a plurality of side walls connected to the ceiling wall and formed with holes through which the cleaning liquid passes. Accordingly, the cleaning liquid can be stored in the chamber while mist diffusion is suppressed.

Moreover, it is preferred in the substrate treating apparatus described above that the cleaning liquid nozzle is located at the bottom in the process tank and supplies the cleaning liquid into the process tank, and the controller causes part of the cleaning liquid, flowing out of the process tank, to be stored in the chamber while supplying the cleaning liquid from the cleaning liquid nozzle into the process tank in a state where the chamber is under atmospheric pressure, and also causes the process tank to be immersed in the cleaning liquid stored in the chamber, thereby causing the chamber cleaning treatment, where the chamber including the outer wall of the process tank is cleaned, to be performed. This achieves cleaning treatment within the chamber while the chamber is under atmospheric pressure. In addition, since the cleaning liquid is supplied also to the process tank, cleaning treatment of the process tank can be performed simultaneously with cleaning treatment within the chamber.

Moreover, it is preferred in the substrate treating apparatus described above that the controller causes the chamber cleaning treatment to be performed between two successive sequences of substrate treatment each time a sequence of substrate treatment, including the immersion treatment and the dry treatment, is performed on a preset number of substrates or on a preset number of lots of substrates. Cleaning treatment of the chamber can be performed between the two successive sequences of substrate treatment each time a sequence of substrate treatment is performed on a preset number of substrates or on a preset number of lots of substrates.

Moreover, it is preferred in the substrate treating apparatus described above that the cleaning liquid nozzle is located at the bottom face in the process tank and supplies the cleaning liquid into the process tank, and the controller causes the cleaning liquid nozzle to supply the cleaning liquid into the process tank and causes part of the cleaning liquid, flowing out of the process tank, to be stored in the chamber in a state where the chamber is under atmospheric pressure. This achieves cleaning of the process tank and the chamber simultaneously.

Another aspect of the present invention provides a substrate treating method for a substrate treating apparatus including a process tank configured to store a treatment liquid, and a chamber configured to surround the process tank. The substrate treating method includes an immersion step of immersing a substrate in the treatment liquid stored in the process tank for a preset period of time, a drying step of drying the substrate, processed with the treatment liquid and taken out of the process tank, with solvent vapor supplied from a solvent vapor nozzle, and a chamber cleaning step of cleaning the chamber including an outer wall of the process tank by supplying a cleaning liquid into the chamber from a cleaning liquid nozzle and immersing the process tank in the cleaning liquid stored in the chamber.

Advantageous Effects of Invention

The substrate treating apparatus and the substrate treating method according to the present invention allow prevention of particles from adhering to a substrate.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
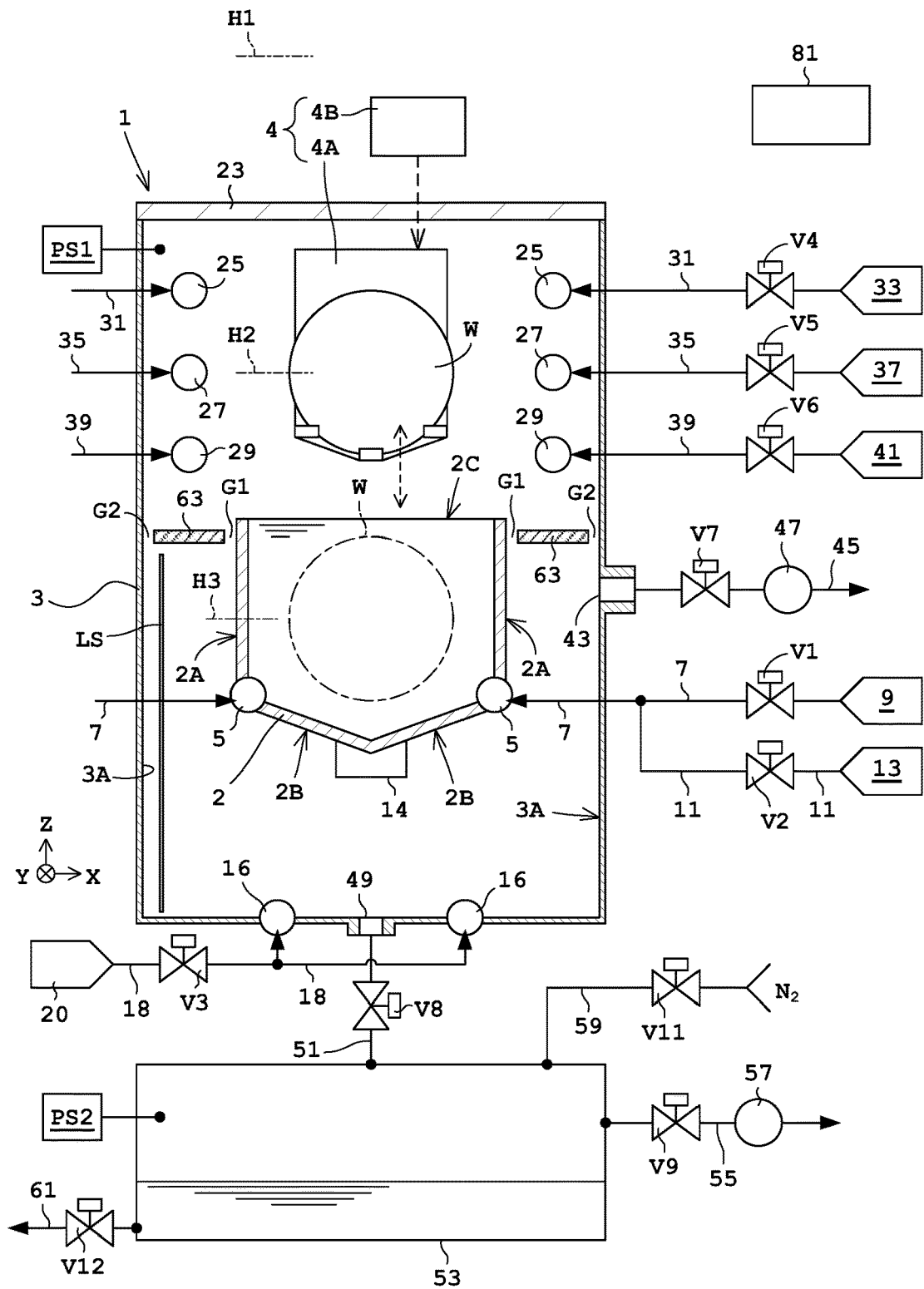
FIG. 1 schematically illustrates a substrate treating apparatus according to a first embodiment.

The following describes a first embodiment of the present invention with reference to drawings. FIG. 1 schematically illustrates a substrate treating apparatus according to the first embodiment.

(1) Configuration of Substrate Treating Apparatus 1

Reference is made to FIG. 1. The substrate treating apparatus 1 includes a process tank 2 for storing a treatment liquid, a chamber 3 for surrounding the process tank 2, and a lifter 4. The process tank 2 is configured in such a manner as to be able to accommodate a plurality of substrates W in an erect posture (vertical posture). The process tank 2 is positioned away from a bottom face of the chamber 3.

The lifter 4 includes a holder 4A for holding the substrates W that are arranged in an erect posture at equal intervals in a Y-direction, and a lifting mechanism 4B for moving the holder 4A in an up-down direction (Z-direction). The lifting mechanism 4B includes, for example, an electric motor or an air cylinder. The lifting mechanism 4B moves a substrate W upward and downward among a "standby position H1" above the chamber 3, a "drying position H2" above the process tank 2 and within the chamber 3, and a "treating position H3" inside of the process tank 2.

Two jet tubes 5 for supplying the treatment liquid into the process tank 2 are provided at a bottom in the process tank 2. The jet tubes 5 are each formed linearly along the Y-direction (back to front direction on the paper plane) where the substrates W are aligned. The jet tubes 5 each have a plurality of ejection ports arranged in the Y-direction.

The jet tubes 5 are each connected to a first end of a treatment liquid pipe 7. A second end of the treatment liquid pipe 7 is connected to a treatment liquid supplying source 9. The treatment liquid supplying source 9 feeds pure water as a treatment liquid to the treatment liquid pipe 7. Deionized water (DIW) is, for example, used as pure water. An on-off valve V1 is arranged on the treatment liquid pipe 7. The on-off valve V1 performs supply of and stops the supply of the pure water. Specifically, when the on-off valve V1 is opened, pure water is supplied from the two jet tubes 5 into the process tank 2. Moreover, when the on-off valve V1 is closed, supply of pure water from the two jet tubes 5 stops.

A first end of a second treatment liquid pipe 11 is connected to the treatment liquid pipe 7 between the two jet tubes 5 and the on-off valve V1. A second end of the second treatment liquid pipe 11 is connected to a second treatment liquid supplying source 13. The second treatment liquid supplying source 13 feeds an isopropyl alcohol solution diluted with pure water (e.g., DIW) (i.e., a mixed liquid of isopropyl alcohol and pure water), as a second treatment liquid, to the second treatment liquid pipe 11. Here, the isopropyl alcohol solution diluted with pure water is hereunder referred to as a "diluted IPA solution". An on-off valve V2 is arranged on the second treatment liquid pipe 11. The on-off valve V2 performs supply of and stops the supply of the diluted IPA solution. The two jet tubes 5 are configured such that pure water and the diluted IPA solution can be selectively supplied by the two on-off valves V1 and V2.

A QDR valve (on-off valve) 14 for discharging the treatment liquid within the process tank 2 to the bottom face of the chamber 3 is provided at the bottom of the process tank 2. When the QDR valve 14 is opened, the treatment liquid within the process tank 2 is rapidly emitted to the bottom face in the chamber 3. When the QDR valve 14 is closed, the treatment liquid can be stored in the process tank 2.

Two cleaning liquid nozzles 16 are provided at a bottom of the chamber 3. The two cleaning liquid nozzles 16 are provided so as to overlap the process tank 2 in plan view. Here, the two cleaning liquid nozzles 16 may be provided so as for the entire thereof to overlap the process tank 2 in plan view. The two cleaning liquid nozzles 16 directly supply a cleaning liquid into the chamber 3. The cleaning liquid nozzles 16 are each configured similarly to the jet tube 5. That is, the cleaning liquid nozzles 16 are each a tube formed linearly along the Y-direction. The cleaning liquid nozzles 16 each have a plurality of ejection ports arranged in the Y-direction.

The two cleaning liquid nozzles 16 are each connected to a first end of a cleaning liquid pipe 18. A second end of the cleaning liquid pipe 18 is connected to a cleaning liquid supplying source 20. The cleaning liquid supplying source 20 supplies pure water, a diluted IPA solution, or a hydrogen peroxide solution diluted with pure water (e.g., DIW) (hereunder, referred to as a "diluted $H_2O_2$ solution") as a cleaning liquid to the cleaning liquid pipe 18. An on-off valve V3 is arranged on the cleaning liquid pipe 18. The on-off valve V3 performs supply of and stops the supply of the cleaning liquid.

The chamber 3 accommodates the process tank 2. The chamber 3 includes an upper cover 23 at a top face thereof that opens and closes freely. Two inert gas nozzles 25, two solvent vapor nozzles 27, and two water-repellent vapor nozzles 29 are provided within the chamber 3. The two inert gas nozzles 25, the two solvent vapor nozzles 27, and the two water-repellent vapor nozzles 29 are provided in this order from the top between the upper cover 23 and the process tank 2.

The six nozzles 25, 27, and 29 are formed linearly so as to extend in the Y-direction. The two inert gas nozzles 25 each have a plurality of ejection ports (not shown) arranged in the Y-direction for ejecting inert gas. Likewise, the four nozzles 27 and 29 each have a plurality of ejection ports.

The two inert gas nozzles 25 each supply inert gas into the chamber 3. The inert gas nozzles 25 are each connected to a first end of a supplying pipe 31. A second end of the supplying pipe 31 is connected to an inert gas supplying source 33. The inert gas supplying source 33 feeds nitrogen gas, for example, as inert gas to the supplying pipe 31. An on-off valve V4 is arranged on the supplying pipe 31. The on-off valve V4 performs supply of and stops the supply of the inert gas.

The two solvent vapor nozzles 27 each supply solvent vapor into the chamber 3. The solvent vapor nozzles 27 are each connected to a first end of a supplying pipe 35. A second end of the supplying pipe 35 is connected to a solvent vapor supplying source 37. The solvent vapor supplying source 37 feeds isopropyl alcohol vapor (hereunder, referred to as "IPA vapor"), for example, as the solvent vapor to the supplying pipe 35. The solvent vapor is generated by evaporating a liquid solvent with a heater. The solvent vapor may contain inert gas (nitrogen gas) as carrier gas. An on-off valve V5 is arranged on the supplying pipe 35. The on-off valve V5 performs supply of and stops the supply of the solvent vapor.

Two water-repellent vapor nozzles 29 each supply water-repellent vapor into the chamber 3. The water-repellent vapor nozzles 29 are each connected to a first end of a supplying pipe 39. A second end of the supplying pipe 39 is connected to a water-repellent vapor supplying source 41. The water-repellent vapor supplying source 41 feeds water-repellent vapor to the supplying pipe 39. The water-repellent vapor is generated by evaporating a liquid water-repellent with a heater. The water-repellent vapor may contain inert gas (nitrogen gas) as carrier gas. An on-off valve V6 is arranged on the supplying pipe 39. The on-off valve V6 performs supply of and stops the supply of the water-repellent vapor.

The water repellent (silylating agent) is silicon-based water repellent for hydrophobizing silicon itself and a chemical compound containing silicon, or a metal-based water repellent for hydrophobizing a metal itself and a chemical compound containing a metal. The water repellent is preferably used while it is diluted with a hydrophilic organic solvent such as IPA and a solvent having compatibility.

The metal-based water repellent includes, for example, at least one of amines having a hydrophobic group and an organosilicon chemical compound.

The silicon-based water repellent is, for example, a silane coupling agent. The silane coupling agent includes, for example, at least one selected from hexamethyldisilazane (HMDS), tetramethylsilane (TMS), fluorinated alkylchlorosilane, alkyldisilazane, and a non-chloro water repellent.

An exhaust port 43 is provided on a side wall of the chamber 3. The exhaust port 43 is located at a level so as to face an outer face 2A of the process tank 2. In other words, the exhaust port 43 is located at a level between a shield plate 63 mentioned later and a lower face 2B of the process tank 2. Accordingly, gas within the chamber 3 can be exhausted from the exhaust port 43 while the cleaning liquid, for example, is stored at a position lower than the exhaust port 43. The exhaust port 43 is connected to an exhaust pipe 45. The exhaust pipe 45 is provided with an on-off valve V7 and an air pump 47 in this order from a side adjacent to the exhaust port 43. The air pump 47 exhausts gas within the chamber 3 for decompressing the chamber 3.

Also, an outlet 49 is provided in a bottom wall of the chamber 3. The outlet 49 is connected to an upper end of an exhaust pipe 51. A lower end of the exhaust pipe 51 is connected to an upper outer wall of a drain tank 53. An on-off valve V8 is arranged on the exhaust pipe 51. The on-off valve V8 is used for feeding the treatment liquid or the cleaning liquid within the chamber 3 to the drain tank 53. The drain tank 53 is a container where the treatment liquid exhausted from the chamber 3 is stored. An exhaust pipe 55 is connected to the drain tank 53. The exhaust pipe 55 is provided with an on-off valve V9 and an air pump 57 in this order from a side adjacent to the drain tank 53.

A gas pipe 59 and an exhaust pipe 61 are also connected to the drain tank 53. An on-off valve V11 is arranged on the gas pipe 59. An on-off valve V12 is arranged on the exhaust pipe 61. The gas pipe 59 feeds inert gas (e.g., nitrogen gas) or outside air to the drain tank 53. The on-off valve V11 performs supply of and stops the supply of the inert gas and the like. The exhaust pipe 61 exhausts the treatment liquid and the like within the drain tank 53.

The drain tank 53 exhausts the treatment liquid and the like at a suitable timing. When the treatment liquid stored in the drain tank 53 is exhausted, the on-off valve V11 opens while the on-off valves V8, V9, V12, for example, are closed to return pressure of the drain tank 53 to atmospheric pressure. Then, the on-off valves V11, V12 open while the on-off valves V8, V9 are closed, to exhaust the treatment liquid within the drain tank 53.

The chamber 3 also includes the shield plate 63. The shield plate 63 is provided slightly below an upper edge (or opening 2C) of the process tank 2 around the entire outer face 2A of the process tank 2. In other words, the shield plate 63 is provided between an outer wall of the process tank 2 and an inner wall of the chamber 3. The shield plate 63 shields atmosphere between an upper part of the chamber 3 (upper space) and a lower part of the chamber 3 (lower space). The shield plate 63 has gaps G1, G2 (openings) where part of the treatment liquid flowing out of the process tank 2 is brought into communication with the lower part of the chamber 3. That is, the shield plate 63 has the gap G1 to the outer wall of the process tank 2 and the gap G2 to the inner wall of the chamber 3. Here, one of the gaps G1, G2 is not necessarily provided where appropriate. The shield plate 63 may be attached to the outer wall of the process tank 2 or the inner wall of the chamber 3.

A pressure sensor PS1 is provided in the chamber 3 for measuring pressure within the chamber 3. Moreover, a pressure sensor PS2 is provided in the drain tank 53 for measuring pressure within the drain tank 53. Moreover, a liquid level sensor LS is provided in the chamber 3 for detecting a liquid level of the cleaning liquid, for example, stored in the chamber 3. Pressure values measured with the pressure sensors PS1, PS2, and liquid level values detected with the liquid level sensor LS are transmitted to a controller 81 mentioned later.

The substrate treating apparatus 1 includes the controller 81 and a memory unit (not shown). The controller 81 controls components of the substrate treating apparatus 1. The controller 81 includes one or more processors like a central processing unit (CPU). The memory unit includes, for example, at least one of a read-only memory (ROM), a random-access memory (RAM), and a hard disk. The memory unit stores computer programs necessary for controlling each component of the substrate treating apparatus 1.

Note that the substrate treating apparatus 1 includes the two cleaning liquid nozzles 16. In this regard, the substrate treating apparatus 1 may include one cleaning liquid nozzle 16 or three or more cleaning liquid nozzles 16. The same is applicable to the two jet tubes 5, the two inert gas nozzles 25, the two solvent vapor nozzles 27, and the two water-repellent vapor nozzles 29.

(2) Operation of Substrate Treating Apparatus 1

Figure 2:
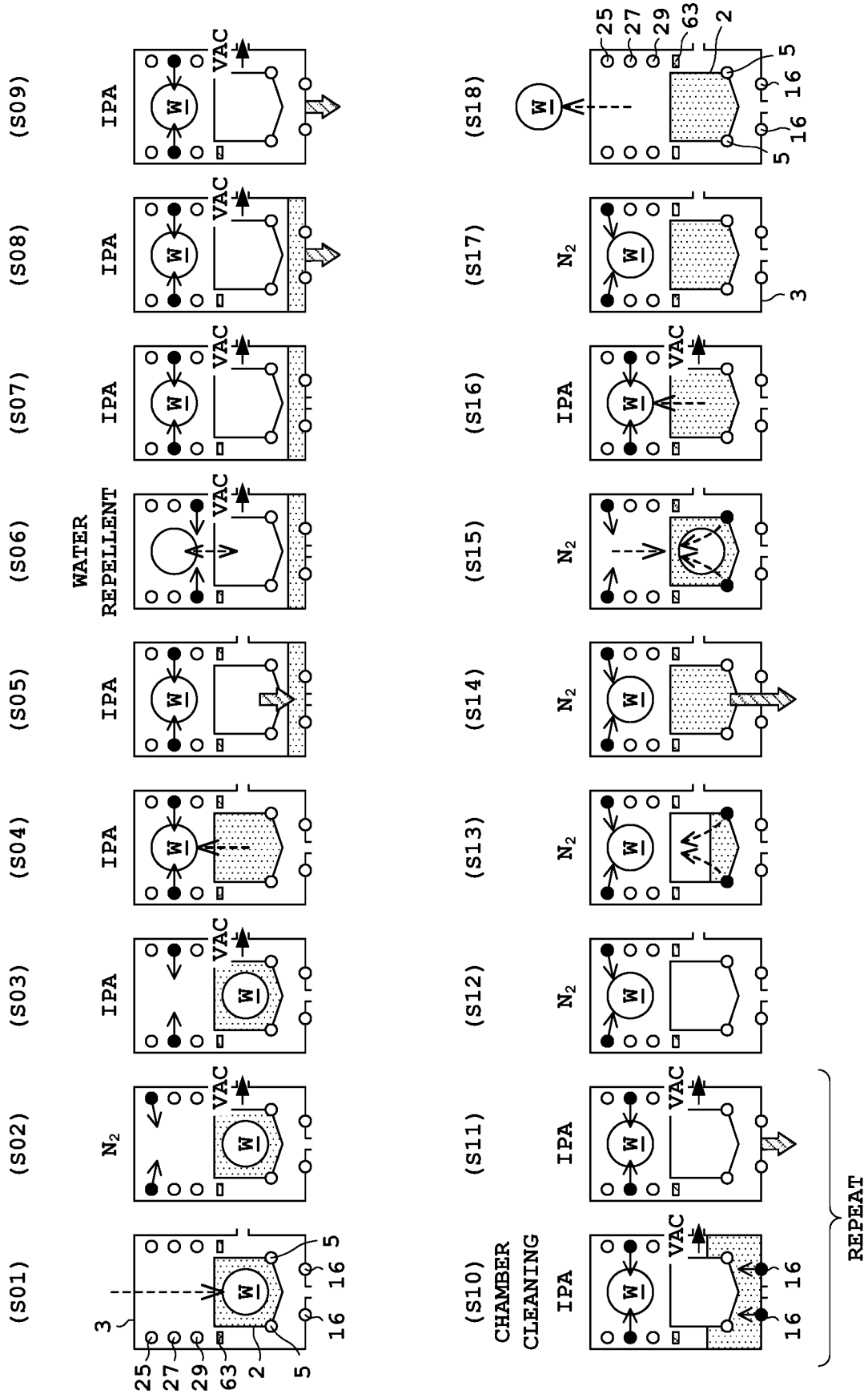
FIG. 2 illustrates operation of the substrate treating apparatus according to the first embodiment.
Figure 3:
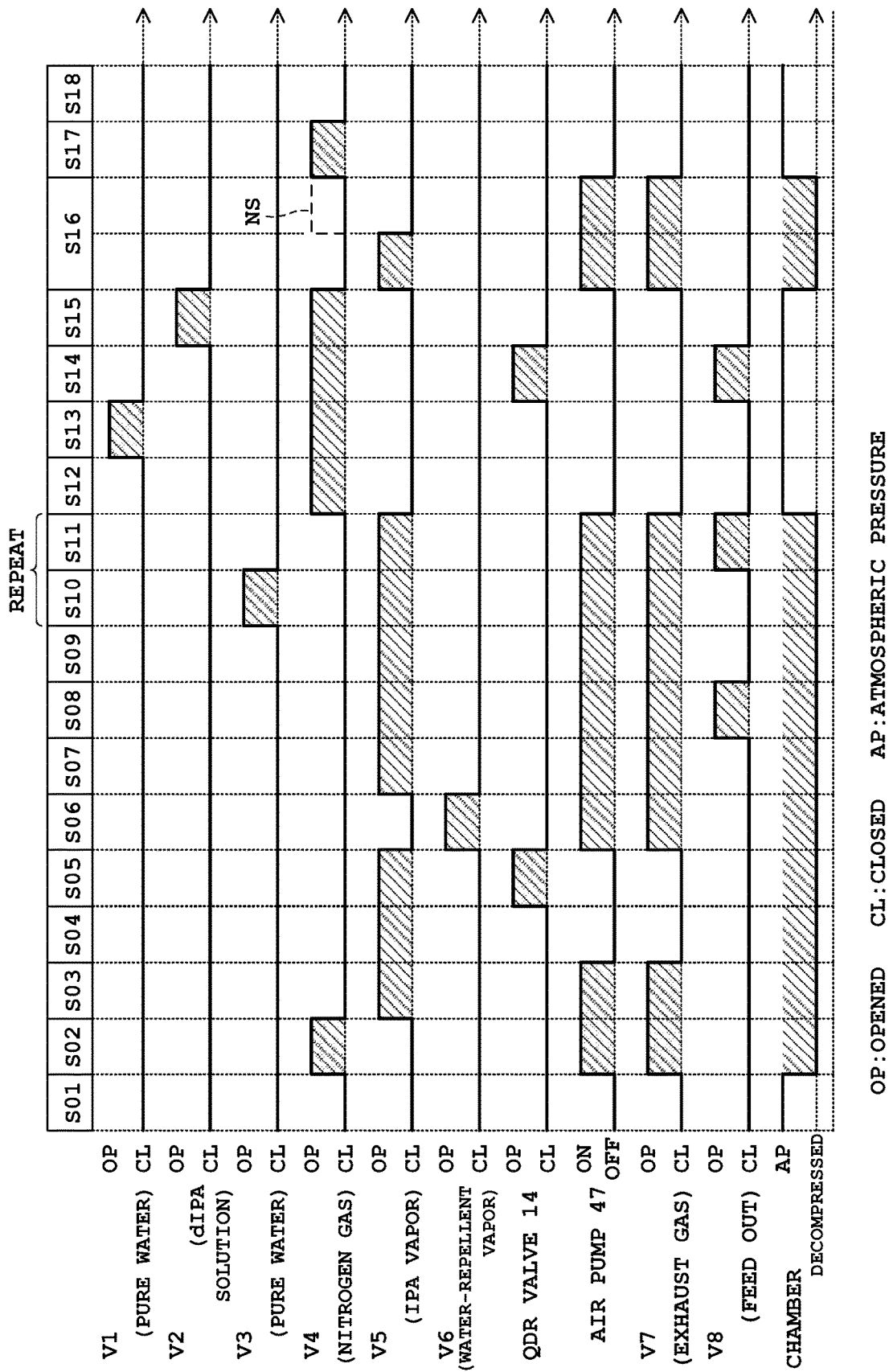
FIG. 3 is a timing chart illustrating operation of the substrate treating apparatus according to the first embodiment.

The following describes operation of the substrate treating apparatus 1 with reference to FIGS. 2 and 3. Here, FIG. 2 omits illustration of the lifter 4. FIG. 2 denotes exhaust operation by the air pump 47 and the like by a numeral "VAC". FIG. 3 refers the diluted IPA solution as a "dIPA solution".

[Step S01] First Immersion Treatment (Loading Substrate into Chamber)

Pure water as the treatment liquid is stored in the process tank 2. Pure water is supplied from the jet tubes 5. Firstly, the upper cover 23 is moved and the top opening of the chamber 3 is opened. The lifter 4 moves a substrate W, held with the holder 4A, downward from the standby position H1 to the treating position H3. That is, the lifter 4 immerses the substrate W entirely in pure water stored in the process tank 2 for a preset period of time. The substrate W is immersed in the pure water, thereby being cleaned. After the substrate W is immersed in the pure water, the upper cover 23 is moved and the top opening of the chamber 3 is closed.

[Step S02] Supply of Nitrogen Gas

Then, the on-off valve V4 is opened to supply nitrogen from the inert gas nozzles 25 into the chamber 3. Moreover, the on-off valve V7 is opened while the air pump 47 actuates, whereby gas within the chamber 3 is exhausted through the exhaust port 43 and the exhaust pipe 45. This achieves the decompressed chamber 3 having lower pressure than atmospheric pressure.

[Step S03] Supply of First IPA Vapor (Forming Atmosphere of IPA Vapor)

The air pump 47 and the like continuously exhausts gas within the chamber 3. The on-off valve V4 is closed to stop supply of nitrogen gas from the inert gas nozzles 25. Then, the on-off valve V5 is opened to supply IPA vapor from the solvent vapor nozzles 27 into the chamber 3 for achieving the chamber 3 under IPA vapor atmosphere.

[Step S04] Supply of First IPA Vapor (Replacing IPA)

The air pump 47 is stopped and the on-off valve V7 is closed. The chamber 3 is under a decompressed state. Moreover, the solvent vapor nozzles 27 continuously supply the IPA vapor. In such a condition as above, the lifter 4 moves the substrate W upward from the treating position H3 to the drying position H2 while picking up the substrate W out of the pure water in the process tank 2. When the substrate W is exposed to the IPA vapor, pure water adhered to the substrate W is replaced by IPA. If a water repellent comes into contact with water, effect of the water repellent decreases. However, replacement by IPA can prevent effect decrease.

[Step S05] Supply of First IPA Vapor (Emitting Treatment Liquid from Process Tank)

The chamber 3 is under a decompressed state. Moreover, the solvent vapor nozzles 27 continuously supply the IPA vapor. In such a condition as above, the QDR valve 14 is opened, thereby emitting pure water within the process tank 2 rapidly to the bottom face in the chamber 3. The QDR valve 14 is closed after the process tank 2 is empty.

[Step S06] Supply of Water-Repellent Vapor

The on-off valve V7 is opened while the air pump 47 actuates, whereby gas within the chamber 3 is exhausted. This can decompress the chamber 3. Moreover, the on-off valve V5 is closed to stop supply of solvent vapor from the solvent vapor nozzles 27. Moreover, the on-off valve V6 is opened to supply water-repellent vapor from the water-repellent vapor nozzles 29 into the chamber 3. At this time, the lifter 4 moves the substrate W upward and downward between the two water-repellent vapor nozzles 29. This achieves uniform supply of the water-repellent vapor over the entire of the substrate W. Accordingly, the IPA adhered to the substrate W is replaced by the water repellent. Then, the water repellent reforms the surface of the substrate W.

[Step S07] Supply of Second IPA Vapor

The air pump 47 and the like continuously exhausts gas within the chamber 3. The on-off valve V6 is closed to stop supply of water-repellent vapor from the water-repellent vapor nozzles 29. Moreover, the on-off valve V5 is opened to supply IPA vapor from the solvent vapor nozzles 27. Supply of the IPA vapor (rinse with IPA vapor) is performed from the step S07 (this step) to a step S11. This can replace the water-repellent vapor atmosphere to the IPA vapor atmosphere within the chamber 3. Moreover, when the substrate W is exposed to the IPA vapor, liquified IPA adheres to the substrate W. Accordingly, particles derived from the water repellent and organic matter are cleaned off from the substrate W by IPA while the water repellent adhered to the surface of the substrate W is replaced by IPA. The particles derived from the water repellent (foreign substances) are generated by direct contact of moisture and the water repellent, for example.

[Step S08] Supply of Second IPA Vapor and Exhaust of Treatment Liquid Outside of Chamber The air pump 47 and the like continuously exhausts gas within the chamber 3. Moreover, the solvent vapor nozzles 27 continuously supply the IPA vapor. In such a condition as above, pure water stored at the bottom of the chamber 3 is exhausted outside of the chamber 3 for chamber cleaning.

Detailed description is as under. In FIG. 1, if the on-off valve V8 is opened when a pressure value P2 within the drain tank 53 is larger than a pressure value P1 within the chamber 3, for example, a reverse flow is generated from the drain tank 53 toward the chamber 3. Accordingly, it is impossible to exhaust pure water in the chamber 3 to the drain tank 53. Then, the on-off valve V9 is firstly opened while the three on-off valves V8, V11, V12 are closed, and the air pump 57 is actuated, whereby gas within the drain tank 53 is exhausted.

The pressure value P1 within the chamber 3 is measured with the pressure sensor PS1. Moreover, the pressure value P2 within the drain tank 53 is measured with the pressure sensor PS2. The air pump 57 exhausts gas within drain tank 53 in such a manner that the pressure value P2 within the drain tank 53 is smaller than the pressure value P1 within the chamber 3. The on-off valve V8 is opened after the pressure value P2 within the drain tank 53 is smaller than the pressure value P1 within the chamber 3, whereby pure water within the chamber 3 can be exhausted to the drain tank 53.

Here, the pressure value P1 within the chamber 3 may be achieved by controlling a flow rate of exhaust gas by the air pump 47. Moreover, the pressure value P1 within the chamber 3 may be achieved by controlling a flow rate of gas passing through the exhaust pipe 45 by the on-off valve V7. Moreover, the pressure value P2 within the drain tank 53 may be achieved by controlling a flow rate of exhaust gas by the air pump 57. Moreover, the pressure value P2 within the drain tank 53 may be achieved by controlling a flow rate of gas passing through the exhaust pipe 55 by the on-off valve V9.

[Step S09] Supply of Second IPA Vapor and Stopping of Exhaust of Treatment Liquid Outside of Chamber The air pump 47 and the like continuously exhausts gas within the chamber 3. Moreover, the solvent vapor nozzles 27 continuously supply the IPA vapor. When the chamber 3 is empty, the on-off valve V8 is closed.

[Step S10] Supply of Second IPA Vapor and Cleaning Treatment within Chamber

The controller 81 causes the cleaning liquid nozzles 16 to supply pure water (cleaning liquid) into the chamber 3 and causes the process tank 2 to be immersed in the pure water stored in the chamber 3, thereby causing cleaning treatment to be performed within the chamber 3 including the outer wall of the process tank 2 in a state where the chamber 3 is decompressed with the air pump 47.

Detailed description is as under. The air pump 47 and the like continuously exhausts gas within the chamber 3. Moreover, the solvent vapor nozzles 27 continuously supply the IPA vapor. In such a condition as above, the on-off valve V3 is opened, thereby supplying pure water (cleaning liquid) from the cleaning liquid nozzles 16 to the chamber 3. When the liquid level sensor LS detects that a liquid level of pure water reaches a level slightly lower than the exhaust port 43, the on-off valve V3 is closed, whereby supply of pure water from the cleaning liquid nozzles 16 is stopped.

The outer wall of the process tank 2 is immersed for a preset period of time. A lower part within the chamber 3 (outer face 2A and lower face 2B of the process tank 2, and inner face 3A of the chamber 3) can be cleaned with pure water stored at the lower part within the chamber 3.

Figure 4A:
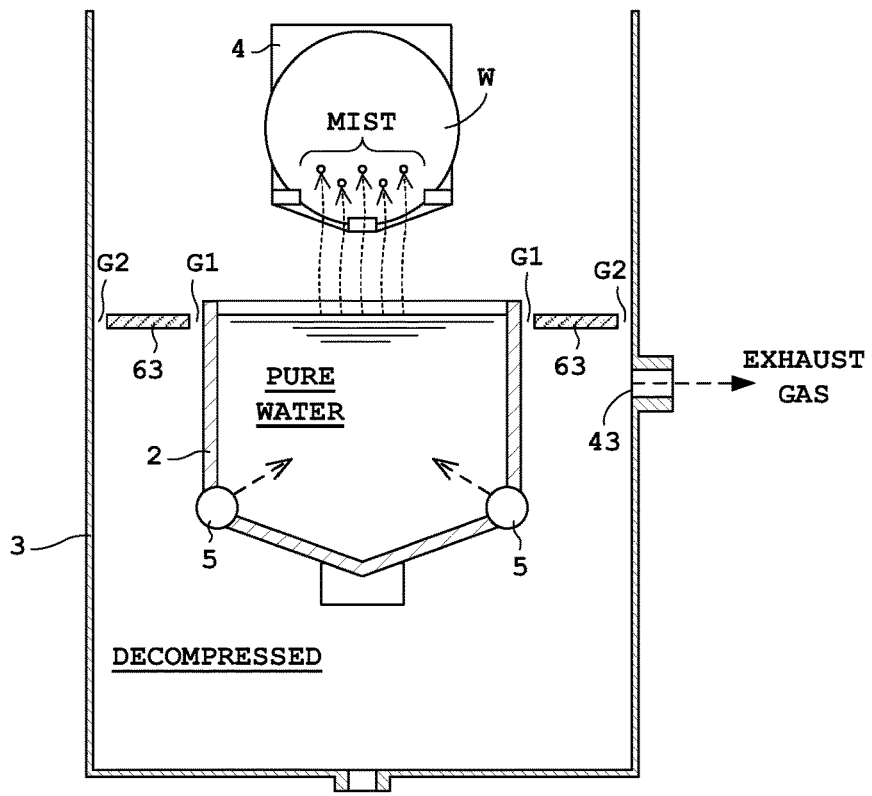
FIG. 4A is an explanatory diagram illustrating a drawback of mist.

The following describes an effect of directly supplying pure water (cleaning liquid) into the chamber 3 through the cleaning liquid nozzles 16. Such a method is present that, in order to supply pure water (cleaning liquid) to the lower part of the chamber 3, pure water flowing out of the process tank 2 is fed to the lower part of the chamber 3 while pure water is supplied from the jet tube 5 to the process tank 2. In this case, as shown in FIG. 4A, mist generated from pure water stored in the process tank 2 is likely to adhere to a substrate W under pressure lower than atmospheric pressure. When mist adheres to the substrate W, moisture of the mist comes into direct contact with the water repellent, leading to possibility of reduced effect of the water repellent and generation of particles (foreign substances). Accordingly, adhesion of the mist to the substrate W is not preferred.

Figure 4B:
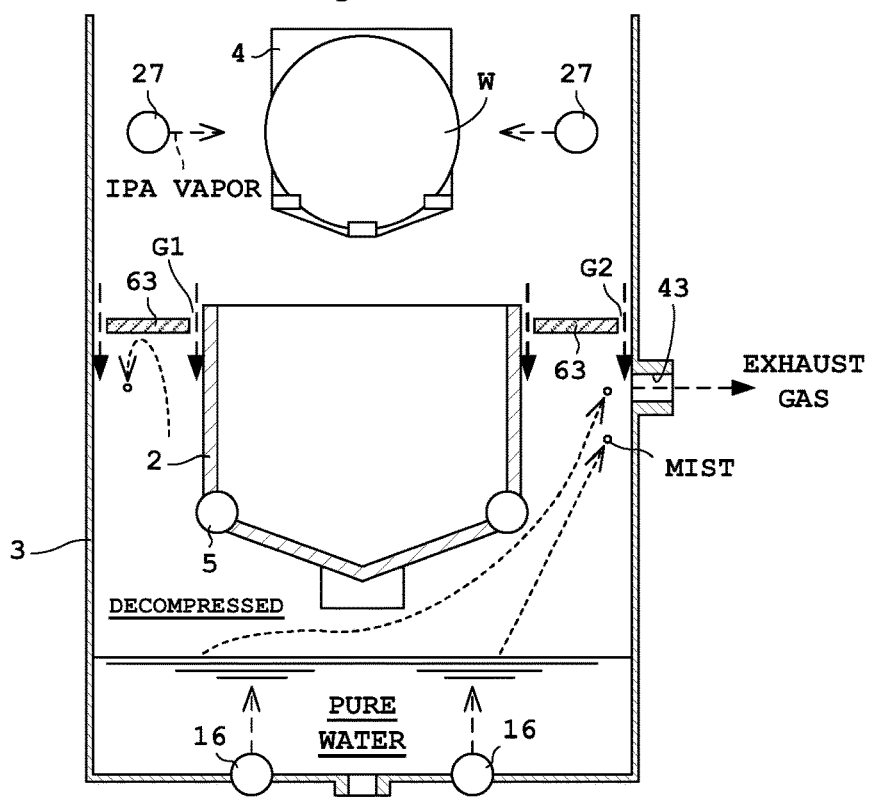
FIG. 4B is an explanatory diagram illustrating an effect of the substrate treating apparatus.

Then, the cleaning liquid nozzles 16 are provided at the bottom of the chamber 3. Accordingly, the substrate W is relatively far from a surface of the pure water even when the pure water is stored in the chamber 3, leading to prevention of the mist from adhering to the substrate W even in generation of the mist (see FIG. 4B). Moreover, the shield plate 63 can prevent the mist from moving toward the upper part of the chamber 3. Moreover, the air pump 47 exhausts gas within the chamber 3. Accordingly, mist is exhausted from the exhaust port 43. Moreover, the solvent vapor nozzles 27 supply IPA vapor at the upper part of the chamber 3 and the air pump 47 exhausts gas. Accordingly, downward airflow is generated at the gaps G1, G2 laterally of the shield plate 63, achieving prevention of the mist from moving toward the upper part of the chamber 3.

[Step S11] Supply of Second IPA Vapor and Exhaust of Cleaning Liquid Outside of Chamber The controller 81 causes exhaust treatment where pure water (cleaning liquid) is exhausted from the outlet 49 provided in the bottom wall of the chamber 3 to be performed in a state where the chamber 3 is decompressed with the air pump 47. That is, the air pump 47 and the like continuously exhausts gas within the chamber 3. Moreover, the solvent vapor nozzles 27 continuously supply the IPA vapor. In such a condition as above, the on-off valve V8 is opened, thereby exhausting pure water within the chamber 3 to the drain tank 53. At this time, with the air pump 57, the pressure value P2 within the drain tank 53 is smaller than the pressure value P1 within the chamber 3. When the chamber 3 is empty, the on-off valve V8 is closed.

Moreover, the two steps S10, S11 may be repeated for a preset number of times (once, or twice or more). That is, the step S10 and the step S11 are performed alternately. Here, such is applicable that the steps S10, S11 are each performed once and are not repeated.

[Step S12] Cleaning of Process Tank (Supply of Nitrogen Gas)

The air pump 47 is stopped and the on-off valve V7 is closed. Moreover, the on-off valve V5 is closed to stop supply of IPA vapor from the solvent vapor nozzles 27. Moreover, the on-off valve V4 is opened to supply nitrogen gas from the inert gas nozzles 25. This can return pressure of the decompressed chamber 3 to atmospheric pressure.

[Step S13] Cleaning of Process Tank (Supply of Cleaning Liquid)

The nitrogen gas is continuously supplied from the inert gas nozzles 25. In such a condition as above, the on-off valve V1 is opened, thereby supplying pure water as the cleaning liquid from the jet tubes 5 into the process tank 2. The pure water stored in the process tank 2 cleans the inside of the process tank 2. Here, the pure water supplied from the jet tubes 5 into the process tank 2 may flow out of the process tank 2 when the pure water is stored in the process tank 2.

[Step S14] Cleaning of Process Tank (Exhaust of Cleaning Liquid)

The nitrogen gas is continuously supplied from the inert gas nozzles 25. In such a condition as above, the QDR valve 14 is opened, thereby emitting pure water within the process tank 2 rapidly to the bottom face in the chamber 3. Moreover, the on-off valve V8 is opened, thereby exhausting the pure water (cleaning liquid) stored at the bottom within the chamber 3 to the drain tank 53. The QDR valve 14 is closed after the process tank 2 is empty. Moreover, the on-off valve V8 is closed after the chamber 3 is empty.

[Step S15] Second Immersion Treatment

The nitrogen gas is continuously supplied from the inert gas nozzles 25. In such a condition as above, the on-off valve V2 is opened, thereby supplying a diluted IPA solution from the jet tubes 5 into the process tank 2. When a preset amount of diluted IPA solution is stored in the process tank 2, the lifter 4 moves the substrate W downward from the drying position H2 to the treating position H3, thereby immersing the substrate W in the diluted IPA solution in the process tank 2 for a preset period of time. Thereby, the substrate W is further cleaned. After the diluted IPA solution is supplied, the on-off valve V2 is closed.

[Step S16] Supply of Third IPA Vapor (Dry Treatment)

The on-off valve V7 is opened while the air pump 47 is actuated, whereby gas within the chamber 3 is exhausted. This can decompress the chamber 3. Moreover, the on-off valve V5 is opened to supply IPA vapor from the solvent vapor nozzles 27. Then, after the state within the chamber 3 turns IPA atmosphere, the lifter 4 moves the substrate W upward from the treating position H3 to the drying position H2 while picking up the substrate W out of the diluted IPA solution in the process tank 2. Accordingly, the diluted IPA solution adhered to the substrate W is replaced by IPA.

The on-off valve V5 is closed to stop supply of IPA vapor from the solvent vapor nozzles 27 while the air pump 47 and the like continuously exhaust gas from the chamber 3. Supply of the IPA vapor stops and the chamber 3 is decompressed, whereby IPA adhered to the substrate W actively volatilizes for performing dry treatment on the substrate W. Here, as shown by a numeral NS in FIG. 3, the nitrogen gas may be supplied from the inert gas nozzles 25 after the supply of IPA vapor stops.

[Step S17] Supply of Nitrogen Gas

The air pump 47 is stopped and the on-off valve V7 is closed. Moreover, the on-off valve V4 is opened to supply nitrogen gas from the inert gas nozzles 25. This can return pressure of the decompressed chamber 3 to atmospheric pressure.

When the chamber 3 is contaminated, if nitrogen gas is supplied while the chamber 3 is under atmospheric pressure, the particles at the lower part of the chamber 3 are swirled and particles passing through the gaps G1, G2 sometimes adhere to the substrate W regardless of provision of the shield plate 63. Cleaning treatment of the chamber 3 can reduce particles swirled by nitrogen gas, resulting in prevention of the particles from adhering to the substrate.

[Step S18] Unloading of Substrate from Chamber

The upper cover 23 is moved and the top opening of the chamber 3 is opened. The lifter 4 moves the substrate W, held with the holder 4A, upward from the drying position H2 to the standby position H1. The substrate W moved upward to the standby position H1 is moved to a next destination by a transport robot not shown.

Here in the steps S10, S11, the cleaning treatment of the chamber 3 and the exhaust treatment of the cleaning liquid are performed simultaneously with the supplying treatment of the second IPA vapor. In this regard, the cleaning treatment of the chamber 3 and the exhaust treatment of the cleaning liquid in the steps S10, S11 may be performed after the supplying treatment of the second IPA vapor in the steps S07 to S11. Simultaneous performance can achieve an effective sequence of substrate treatment.

Specifically, the controller 81 causes the chamber cleaning treatment to be performed when the solvent vapor nozzles 27 supply the solvent vapor into the chamber 3 (steps S10, S11). The chamber cleaning treatment can be performed simultaneously with the supply of the solvent vapor into the chamber 3, achieving effective treatment on the substrate W.

With this embodiment, the cleaning liquid nozzles 16 supply the cleaning liquid into the chamber 3 to immerse the process tank 2 in the cleaning liquid stored in the chamber 3, whereby the chamber cleaning treatment, where the inside of the chamber 3 including the outer wall of the process tank 2 is cleaned, is performed. This achieves cleaning off of particles adhered not only to the outer wall of the process tank 2 (including outer face 2A and lower face 2B) but also to the side wall and the bottom wall in the chamber 3. Accordingly, particles at a lower part of the chamber 3 can be prevented from swirling up and adhering to the substrate W.

Moreover, the substrate treating apparatus 1 further includes the water-repellent vapor nozzles 29 for supplying water-repellent vapor into the chamber 3. After the immersion treatment (S01), a water-repellent vapor supply treatment is performed (step S06) where the controller 81 causes the two water-repellent vapor nozzles 29 to supply water-repellent vapor into the chamber 3 for making the substrate W water-repellent. The controller 81 causes the chamber cleaning treatment (step S10) to be performed after the water-repellent vapor supply treatment.

This achieves cleaning treatment of the chamber 3 midstream of a sequence of substrate treatment (steps S01 to S18). Moreover, the water-repellent vapor supply treatment for making the substrate W water-repellent (step S06) generates many particles derived from the water repellent. The particles accumulate on the lower part of the chamber 3. Then, the particles at the lower part of the chamber 3 swirl and adhere to the substrate W. Such a drawback is present. This embodiment achieves cleaning treatment of the chamber 3 midstream of a sequence of substrate treatment. Accordingly, the particles (including particles derived from the water repellent) at the lower part of the chamber 3 can be prevented from swirling up and adhering to the substrate W.

Moreover, the substrate treating apparatus 1 further includes the air pump 47 for exhausting gas from the chamber 3. The cleaning liquid nozzles 16 are provided at the lower part of the chamber 3 for supplying the cleaning liquid into the chamber 3. The controller 81 causes the chamber cleaning treatment to be performed in a state where the chamber 3 is decompressed with the air pump 47.

This achieves cleaning treatment of the chamber 3 in a state where the chamber 3 is decompressed while exhausting gas from the chamber 3 with the air pump 47. Moreover, such a case is assumed where the cleaning liquid is supplied to the process tank 2 to flow out of the process tank 2 and to be stored in the chamber 3. In this case where the chamber 3 is decompressed, mist is likely to be generated from the cleaning liquid stored in the process tank 2 and the generated mist is likely to adhere to the substrate W. Such a drawback is present. For example, when moisture of the mist directly comes into contact with the water repellent adhered to the substrate W, an effect of the water repellent may possibly decrease. Moreover, when moisture directly comes into contact with the water repellent, particles may possibly be generated. Moreover, this may cause another reason for particle adhesion. With this embodiment, since the cleaning liquid nozzle 16 provided at the lower part of the chamber 3 can directly supply the cleaning liquid into the chamber 3, the substrate W can be separated from the cleaning liquid. This can suppress adhesion of the generated mist to the substrate.

Moreover, the air pump 47 exhausts gas within the chamber 3 through the exhaust port 43 provided in the side wall of the chamber 3 laterally of the process tank 2. The controller 81 causes the chamber cleaning treatment to be performed in a state where the chamber 3 is decompressed with the air pump 47 while exhausting gas within the chamber 3. Even if mist is generated from the cleaning liquid, the air pump 47 can exhaust the mist from the exhaust port 43.

Moreover, the substrate treating apparatus 1 includes the shield plate 63 provided between the outer wall of the process tank 2 and the inner wall of the chamber 3 for shielding an atmosphere between the upper part of the chamber 3 and the lower part of the chamber 3. The shield plate 63 has gaps (openings) G1, G2 where part of the treatment liquid flowing out of the process tank 2 is brought into communication with the lower part of the chamber 3. Provision of the shield plate 63 can suppress mist flow from the lower part to the upper part of the chamber 3 even if mist is generated from the cleaning liquid stored in the chamber 3. This can also suppress flow of the swirled particles from the lower part to the upper part of the chamber 3.

Moreover, the cleaning liquid nozzles 16 are provided at the bottom of the chamber 3 at a position overlapping the process tank 2 in plan view. This allows the cleaning liquid nozzle 16 to be hidden behind the process tank 2. Moreover, the cleaning liquid nozzle 16 is spaced away from the substrate W at the upper part of the chamber 3, leading to prevention of the mist from adhering to the substrate W even in generation of the mist.

Moreover, the controller 81 causes exhaust treatment where the cleaning liquid is exhausted from the outlet 49 provided in the chamber 3 to be performed in a state where the chamber 3 is decompressed with the air pump 47. The controller 81 causes the chamber cleaning treatment (step S10) and the exhaust treatment (step S11) to be performed for a preset number of times. The more times the chamber cleaning treatment is repeated, the more satisfactorily the chamber 3 is cleaned.

Moreover, the substrate treating apparatus 1 further includes the inert gas nozzles 25 for supplying inert gas into the chamber 3. The controller 81 performs control such that the inert gas nozzles 25 supply inert gas into the chamber 3 after the dry treatment (step S16), thereby returning pressure of the decompressed chamber 3 to atmospheric pressure (step S17). Cleaning treatment within the chamber 3 achieves reduction of particles swirled by the inert gas.

SECOND EMBODIMENT

The following describes a second embodiment of the present invention with reference to the drawings. Here, the description common to that of the first embodiment is to be omitted. In the first embodiment, the chamber 3 is cleaned simultaneously with the supply of the second IPA vapor (steps S07 to S11) midstream of a sequence of substrate treatment shown in the steps S01 to S18 in FIG. 2 in a state where the chamber 3 is decompressed. In this regard, in the second embodiment, the chamber 3 is cleaned simultaneously with cleaning of the process tank 2 (steps S28 to S31) while the chamber 3 is under atmospheric pressure.

Figure 5:
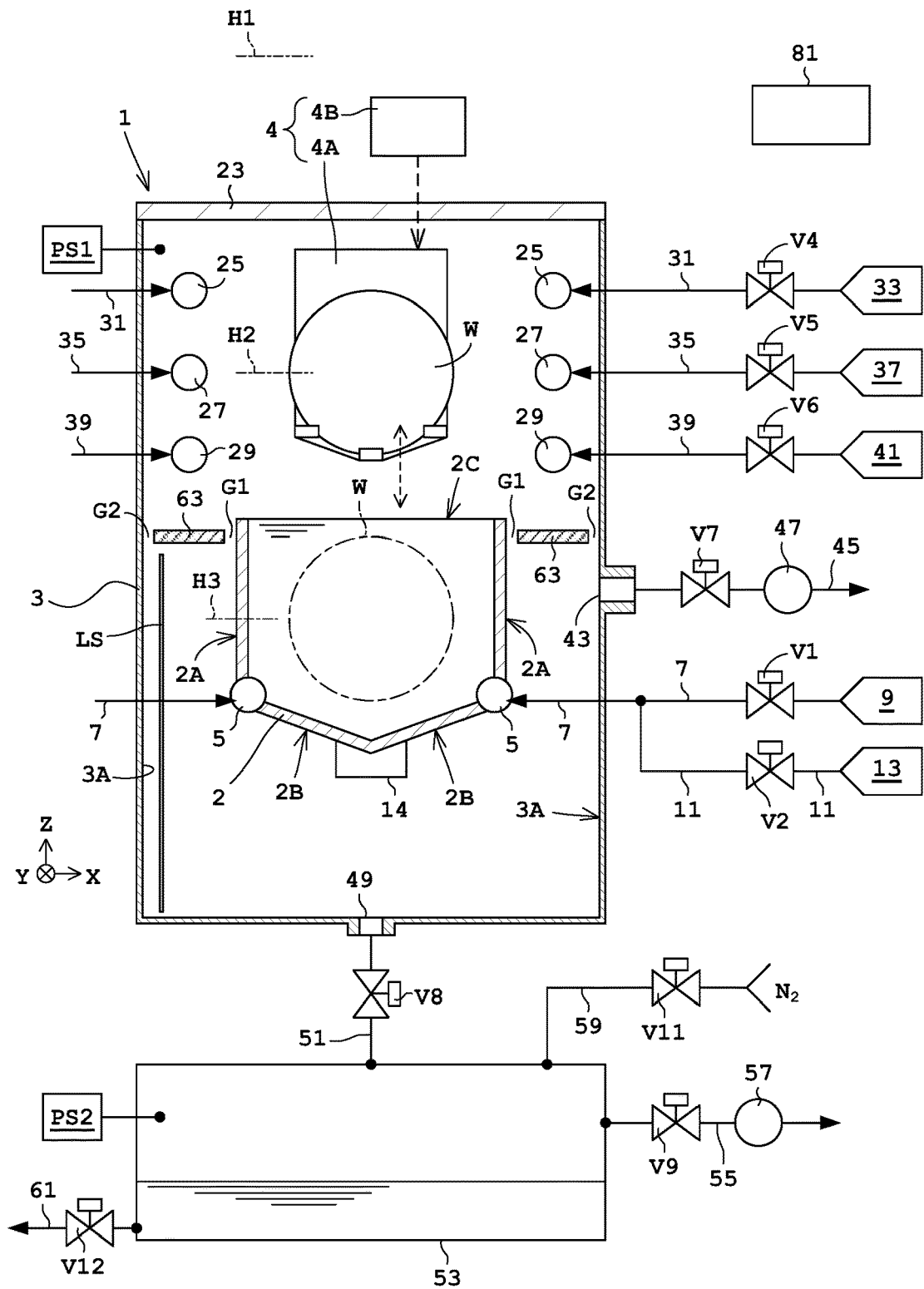
FIG. 5 schematically illustrates a substrate treating apparatus according to a second embodiment.

FIG. 5 schematically illustrates a substrate treating apparatus 1 according to the second embodiment of the present invention. The substrate treating apparatus 1 shown in FIG. 5 does not include the cleaning liquid nozzle 16 and the like provided at the bottom of the chamber 3, which differs from the substrate treating apparatus 1 in the first embodiment shown in FIG. 1. The configuration other than the above is the same as that of the substrate treating apparatus 1 in the first embodiment. Here, the jet tube 5 corresponds to the cleaning liquid nozzle in the present invention.

(3) Operation of Substrate Treating Apparatus 1

Figure 6:
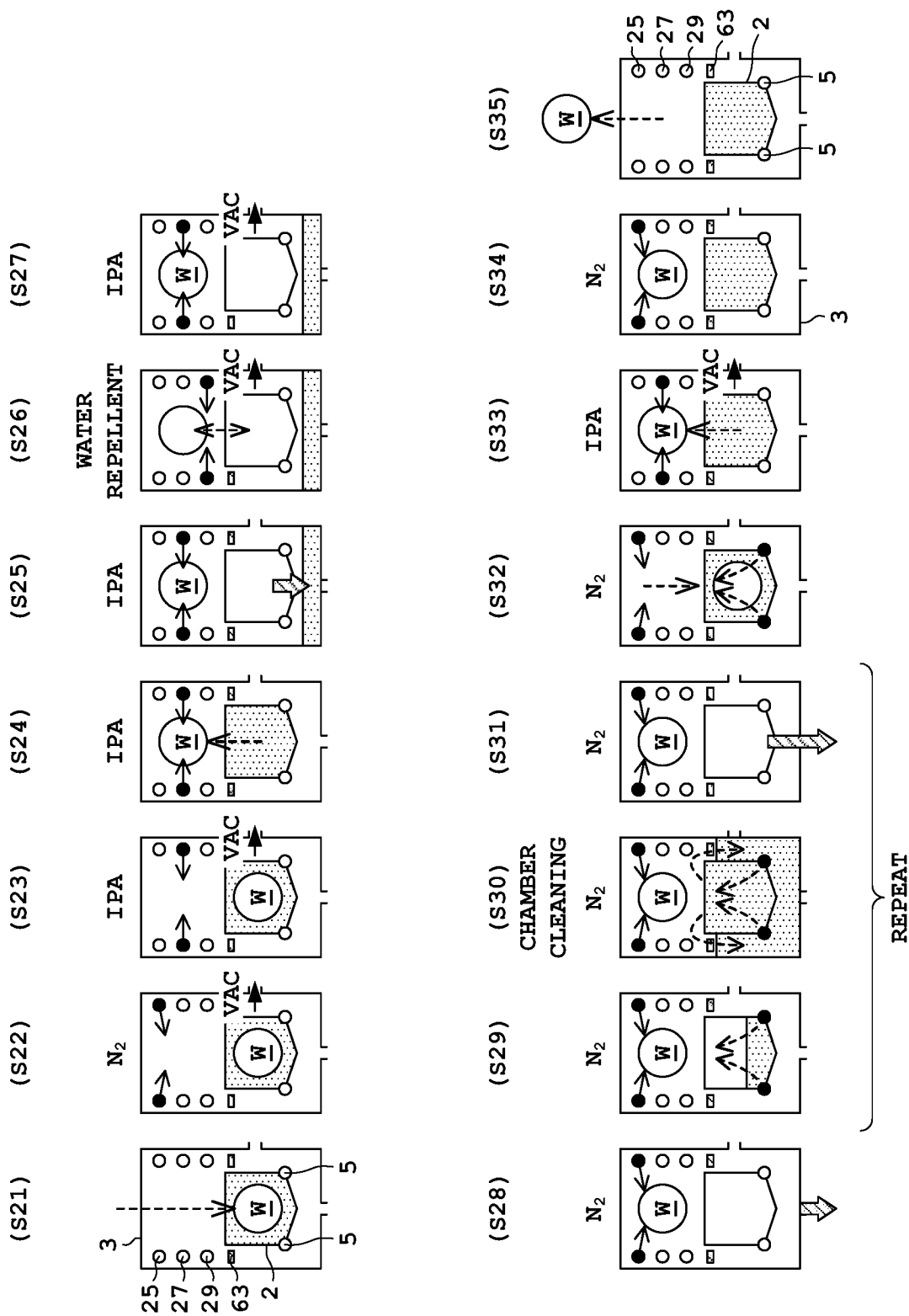
FIG. 6 illustrates operation of the substrate treating apparatus according to the second embodiment.
Figure 7:
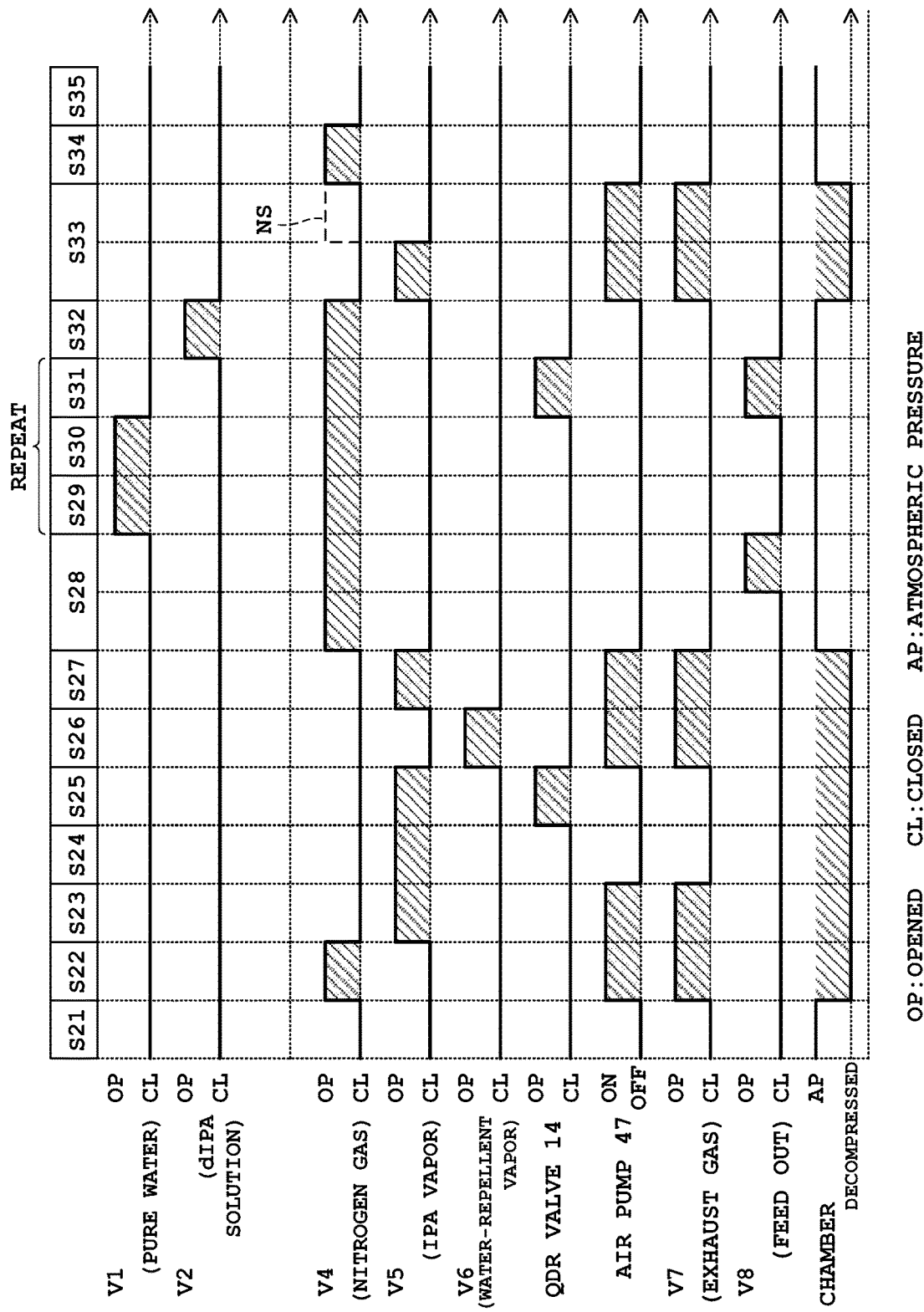
FIG. 7 is a timing chart illustrating operation of the substrate treating apparatus according to the second embodiment.

The following describes operation of the substrate treating apparatus 1 with reference to FIGS. 6 and 7. Note that detailed description is omitted of steps S21 to S27 and S32 to S35 in FIG. 6 since these are the same as the steps S01 to S07 and S15 to S18 in FIG. 2, respectively, in the first embodiment. In the step S27, IPA vapor is sufficiently supplied.

The lifter 4 immerses a substrate W in pure water stored in the process tank 2 (step S21). Then, the inert gas nozzles 25 supply nitrogen gas while the upper cover 23 is closed (step S22). Then, the solvent vapor nozzles 27 supply IPA vapor (step S23). Then, the lifter 4 takes the substrate W out of the process tank 2, and exposes the substrate W in the IPA vapor atmosphere (step S24). Then, the QDR valve 14 is opened, thereby emitting pure water within the process tank 2 to the lower face of the chamber 3 (step S25).

Then, the water-repellent vapor nozzles 29 supply water-repellent vapor to make the substrate W water-repellent (step S26). Then, the solvent vapor nozzles 27 supply IPA vapor to clean off the water repellent and the particles derived from the water repellent, adhered to the surface of the substrate W, by the IPA vapor (step S27). Here, in the steps S22, S23, S26, S27, the air pump 47 exhausts gas within the chamber 3 for decompression. Moreover, in the steps S22 to S27, the chamber 3 is under a decompressed state.

[Step S28] Cleaning of Process Tank (Supply of Nitrogen Gas) and Exhaust of Treatment Liquid The air pump 47 is stopped and the on-off valve V7 is closed. Moreover, the on-off valve V5 is closed to stop supply of IPA vapor from the solvent vapor nozzles 27. Moreover, the on-off valve V4 is opened to supply nitrogen gas from the inert gas nozzles 25. This can return pressure of the decompressed chamber 3 to atmospheric pressure.

After the chamber 3 returns to atmospheric pressure, the on-off valve V8 is opened, thereby exhausting the pure water (treatment liquid) stored in the chamber 3 to the drain tank 53. When all the pure water stored in the chamber 3 is exhausted, i.e., when the liquid level sensor LS detects that the chamber 3 is empty, the on-off valve V8 is closed.

[Step S29] Cleaning of Process Tank (Supply of Cleaning Liquid to Process Tank)

Then, the nitrogen gas is continuously supplied from the inert gas nozzles 25. The chamber 3 is under atmospheric pressure. In such a condition as above, the on-off valve V1 is opened, thereby supplying pure water as the cleaning liquid from the jet tubes 5 into the process tank 2. The pure water is stored in the process tank 2.

[Step S30] Cleaning of Process Tank (Supply of Cleaning Liquid to Chamber, Cleaning of Chamber)

Then, pure water flowing out of an opening 2C of the process tank 2 is stored in the chamber 3 while the jet tubes 5 supply pure water. Here, the shield plate 63 is provided laterally of the process tank 2. The shield plate 63 has gaps G1, G2 where part of the pure water flowing out of the process tank 2 is brought into communication with the lower part of the chamber 3. The pure water is stored up to a position slightly lower than the opening 2C of the process tank 2, specifically slightly lower than the shield plate 63. When the liquid level sensor LS detects that a preset liquid level is obtained, the on-off valve V1 is closed, whereby supply of pure water from the jet tubes 5 is stopped. Then, a state where the pure water is stored in the process tank 2 and the chamber 3 is maintained for a preset period of time.

[Step S31] Cleaning of Process Tank (Exhaust of Cleaning Liquid)

Then, the nitrogen gas is continuously supplied from the inert gas nozzles 25. The on-off valve V8 is opened, thereby exhausting the pure water stored in the chamber 3 to the drain tank 53. Further, the QDR valve 14 is opened, thereby emitting pure water from the process tank 2 to the bottom face of the chamber 3. The pure water in the process tank 2 is also exhausted to the drain tank 53 via the exhaust pipe 51. The QDR valve 14 is closed after the process tank 2 is empty. Moreover, the on-off valve V8 is closed after the chamber 3 is empty. Here, in order to keep a degree of cleanness of the process tank 2, the pure water within the chamber 3 may firstly be exhausted to the drain tank 53 and then the pure water within the process tank 2 may be exhausted to the drain tank 53.

Moreover, the three steps S29 to S31 may be repeated for a preset number of times (once, or twice or more). Cleaning treatment of the process tank 2 and the chamber 3 in the steps S29, S30 and exhaust treatment in the step S31 are repeated for a preset number of times. Here, such is applicable that the steps S29 to S31 are each performed once and are not repeated.

Then, the jet tubes 5 supply the diluted IPA solution into the process tank 2 to immerse the substrate W in the diluted IPA solution stored in the process tank 2 (step S32). Then, the substrate W treated by the diluted IPA solution is dried with the IPA vapor supplied from the solvent vapor nozzles 27 (step S33). Thereafter, the nitrogen gas is supplied to return pressure of the chamber 3 to atmospheric pressure (step S34). Thereafter, the substrate W is taken out of the chamber 3, and is moved to a next destination (step S35).

According to this embodiment, the jet tubes 5 are provided at the bottom in the process tank 2. The jet tubes 5 supply the cleaning liquid into the process tank 2, supplying the cleaning liquid into the chamber 3 via the process tank 2. The controller 81 causes the jet tubes 5 to supply the cleaning liquid into the process tank 2 while the chamber 3 is under atmospheric pressure, and causes the cleaning liquid flowing out of the process tank 2 to be stored in the chamber 3 and causes the process tank 2 to be immersed in the cleaning liquid stored in the chamber 3, thereby causing the chamber cleaning treatment, where the chamber 3 including the outer wall of the process tank 2 is cleaned, to be performed. This achieves cleaning treatment of the chamber 3 while the chamber 3 is under atmospheric pressure. Accordingly, particles at a lower part of the chamber 3 can be prevented from swirling up and adhering to the substrate W. In addition, since the cleaning liquid is supplied also to the process tank 2, cleaning treatment of the process tank 2 can be performed simultaneously with cleaning treatment of the chamber 3.

Here in the steps S29 to S31, the supply of the cleaning liquid to the process tank 2, the supply of the cleaning liquid to the chamber 3 (cleaning of the chamber 3), and the exhaust of the cleaning liquid are performed simultaneously with the cleaning of the process tank 2. In this regard, the supply of the cleaning liquid to the chamber 3 (cleaning of the chamber 3) and the like may be performed before and after the cleaning of the process tank 2. Simultaneous performance can achieve an effective sequence of substrate treatment.

THIRD EMBODIMENT

The following describes a third embodiment of the present invention with reference to the drawings. Here, the description common to that of the first and second embodiments is to be omitted. In the first embodiment, the chamber 3 is cleaned midstream of a sequence of substrate treatment shown by the steps S01 to S18 in FIG. 2. In this regard, in the third embodiment, the chamber 3 is cleaned between two successive sequences of substrate treatment.

The substrate treating apparatus 1 in the third embodiment includes the same configuration as that of the substrate treating apparatus 1 in the second embodiment shown in FIG. 5.

(4) Operation of Substrate Treating Apparatus 1

Figure 8:
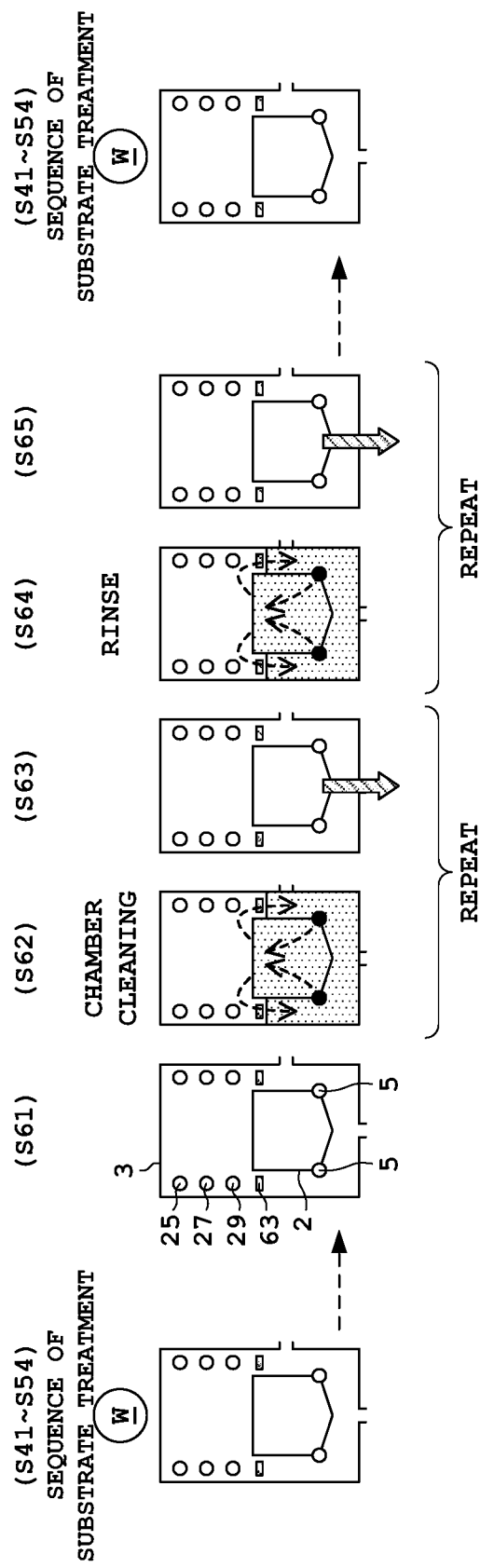
FIG. 8 illustrates operation of a substrate treating apparatus according to a third embodiment.
Figure 9:
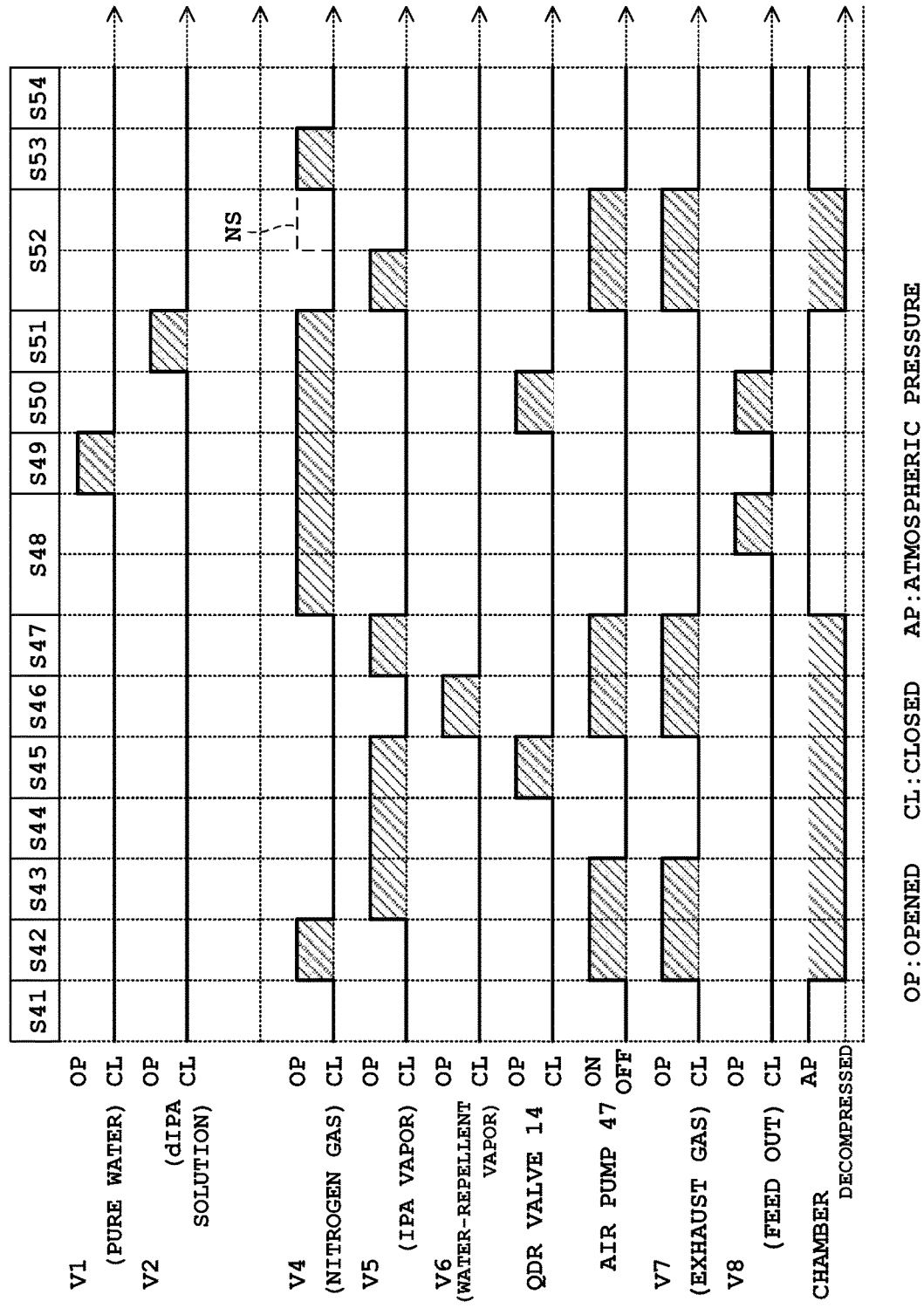
FIG. 9 is a timing chart illustrating operation (a sequence of substrate treatment) of the substrate treating apparatus according to the third embodiment.
Figure 10:
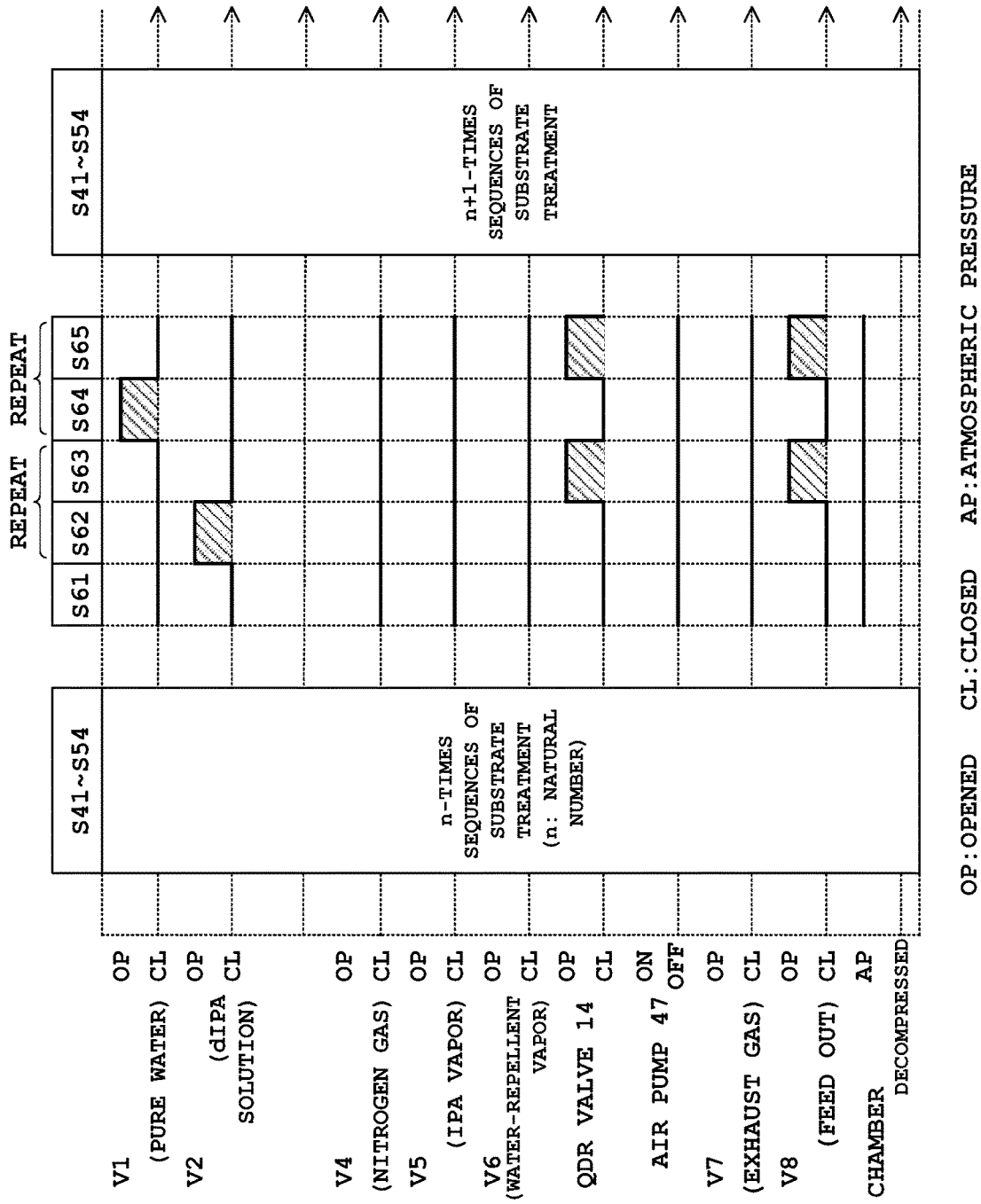
FIG. 10 is a timing chart illustrating operation (cleaning inside of a chamber) of the substrate treating apparatus according to the third embodiment.

An operation of the substrate treating apparatus 1 will now be described with reference to FIGS. 8 to 10. FIG. 8 illustrates operation of a substrate treating apparatus according to a third embodiment. FIG. 9 is a timing chart illustrating operation (a sequence of substrate treatment) of the substrate treating apparatus according to the third embodiment. FIG. 10 is a timing chart illustrating operation (cleaning of the chamber 3) of the substrate treating apparatus according to the third embodiment.

In this embodiment, the cleaning treatment of the chamber 3 is performed between a given sequence of substrate treatment (steps S41 to S54 in FIG. 9) and a next sequence of substrate treatment (steps S41 to S54 in FIG. 9). Moreover, the cleaning treatment of the chamber 3 is performed each time a sequence of substrate treatment (steps S41 to S54) including immersion treatment (step S41) and dry treatment (step S52) is performed on a preset number of substrates W or on a preset number of lots of substrates W.

Treatment of substrates W is performed in lots. For example, twenty-five substrates W accommodated in a carrier for transporting substrates W are treated as one lot.

For a sequence of substrate treatment in FIG. 9, description of the steps S41 to S54 in FIG. 9 is to be omitted since these steps are the same as the steps S01 to S07 and S13 to S18 in FIG. 3 in the first embodiment as well as the steps S28 in FIG. 7 in the second embodiment. In the step S47, IPA vapor is sufficiently supplied.

The following describes cleaning treatment of the chamber 3 in this embodiment. Reference is made to FIGS. 8 and 10. The controller 81 counts, for example, the number of substrates W subjected to a sequence of substrate treatment. Then, it is assumed that, when a sequence of substrate treatment is performed at preset times (e.g., fifth), the number of substrates W subjected to a sequence of substrate treatment exceeded a preset number. At this time, the controller 81 causes cleaning treatment to be performed on the chamber 3 between a preset-time (fifth) sequence of substrate treatment and a next (sixth) sequence of substrate treatment. Here, the count number of substrates W is reset (to zero). The same is applicable to the lot number. That is, the controller 81 counts the lot number of substrates W subjected to a sequence of substrate treatment. Then, it is assumed that, when a sequence of substrate treatment is performed at preset times (e.g., fifth), the lot number of substrates W subjected to a sequence of substrate treatment exceeded a preset lot number. At this time, the controller 81 causes cleaning treatment to be performed on the chamber 3 between a preset-time (fifth) sequence of substrate treatment and a next (sixth) sequence of substrate treatment.

[Step S61] Cleaning Preparation

The chamber 3 is under atmospheric pressure. Here, the chamber 3 is under atmospheric pressure between a step S61 to a step S65. Moreover, in the step S61, the chamber 3 has no treatment liquid and the like stored therein, and thus is empty.

[Step S62] Supply of Cleaning Liquid

Thereafter, the on-off valve V2 is opened while the QDR valve 14 and the on-off valves V7, V8 are closed, thereby supplying diluted IPA solution, for example, as the cleaning liquid from the jet tubes 5 into the process tank 2. Moreover, the diluted IPA solution flows out of the opening 2C of the process tank 2, and the diluted IPA solution flowing out of the process tank 2 is stored in the chamber 3. Then, when the liquid level sensor LS detects that the diluted IPA solution within the chamber 3 reaches a preset liquid level, the on-off valve V2 is closed to stop supply of the diluted IPA solution. Then, a state where the diluted IPA solution is stored in the process tank 2 and the chamber 3 is maintained for a preset period of time. In this embodiment, the diluted IPA solution is supplied as the cleaning liquid. In this regard, however, a diluted $H_2O_2$ solution or pure water is adoptable.

[Step S63] Exhaust of Cleaning Liquid

Then, the on-off valve V8 is opened, thereby exhausting the diluted IPA solution stored in the chamber 3 to the drain tank 53. Further, the QDR valve 14 is opened, thereby emitting the diluted IPA solution from the process tank 2 to the bottom face of the chamber 3. The diluted IPA solution in the process tank 2 is also exhausted to the drain tank 53 via the exhaust pipe 51. The QDR valve 14 is closed after the process tank 2 is empty. Moreover, the on-off valve V8 is closed after the chamber 3 is empty.

These steps S62, S63 may be repeated for a preset number of times (once or twice or more). Here, such is applicable, where appropriate, that the steps S62, S63 are each performed once and are not repeated.

[Step S64] Supply of Rinse Liquid

After the step S63, the on-off valve V1 is opened while the QDR valve 14 and the on-off valves V7, V8 are closed, thereby supplying pure water, for example, as the rinse liquid from the jet tubes 5 into the process tank 2. Moreover, the pure water flows out of the opening 2C of the process tank 2, and the pure water flowing out of the process tank 2 is stored in the chamber 3. Then, when the liquid level sensor LS detects that the pure water within the chamber 3 reaches a preset liquid level, the on-off valve V1 is closed to stop supply of the pure water. Then, a state where the pure water is stored in the process tank 2 and the chamber 3 is maintained for a preset period of time.

[Step S65] Exhaust of Rinse Liquid

Thereafter, the on-off valve V8 is opened, thereby exhausting the pure water stored in the chamber 3 to the drain tank 53. Further, the QDR valve 14 is opened, thereby emitting pure water from the process tank 2 to the bottom face of the chamber 3. The pure water in the process tank 2 is also exhausted to the drain tank 53 via the exhaust pipe 51. The QDR valve 14 is closed after the process tank 2 is empty. Moreover, the on-off valve V8 is closed after the chamber 3 is empty.

The steps S64, S65 may be repeated for a preset number of times (once, or twice or more). Here, such is applicable, where appropriate, that the steps S64, S65 are each performed once and are not repeated.

After the cleaning treatment of the chamber 3 in the steps S61 to S65, a next sequence of substrate treatment (S41 to S54) is performed.

With this embodiment, the controller 81 causes the chamber cleaning treatment to be performed between two successive sequences of substrate treatment each time a sequence of substrate treatment including immersion treatment and dry treatment is performed on a preset number of substrates W or on a preset number of lots of substrates W. The cleaning treatment of the chamber 3 can be performed between two successive sequences of substrate treatment each time a sequence of substrate treatment is performed on a preset number of substrates W or on a preset number of lots of substrates W. Accordingly, particles at a lower part of the chamber 3 can be prevented from swirling up and adhering to the substrate W.

Moreover, the jet tubes 5 are provided at the bottom within the process tank 2 and supply the cleaning liquid into the process tank 2. The controller 81 causes the jet tubes 5 to supply the cleaning liquid into the process tank 2 while the chamber 3 is under atmospheric pressure, and causes the cleaning liquid flowing out of the process tank 2 to be stored in the chamber 3 and causes the process tank 2 to be immersed in the cleaning liquid stored in the chamber 3, thereby cleaning the chamber 3 including the outer wall of the process tank 2. This achieves cleaning of the process tank 2 and the chamber 3 simultaneously.

The present invention is not limited to the foregoing examples, but may be modified as follows.

(1) In the third embodiment described above, the jet tubes 5 supply the diluted IPA solution as the cleaning liquid in the step S62. When pure water is used as the cleaning liquid, the steps S64, S65 may be omitted.

(2) In the first and second embodiments described above, the cleaning treatment of the chamber 3 is not performed between two successive sequences of substrate treatment. In this regard, in each of the first and second embodiments, the cleaning treatment of the chamber 3 may be performed between two successive sequences of substrate treatment as in the third embodiment in addition to the cleaning treatment of the chamber 3 midstream of the sequence of substrate treatment. That is, the sequence of substrate treatment (steps S41 to S54) in FIGS. 8 and 10 may be replaced by the sequence of substrate treatment (steps S01 to S18 shown in FIGS. 2 and 3). Moreover, the sequence of substrate treatment (steps S41 to S54) may be replaced by the sequence of substrate treatment (steps S21 to S35 shown in FIGS. 6 and 7).

(3) In the second and third embodiments described above, only the jet tubes 5 supply the cleaning liquid (see FIG. 5). In this regard, the cleaning liquid nozzles 16 in FIG. 1 may be provided at the bottom of the chamber 3. In supply of the cleaning liquid (e.g., pure water), the jet tubes 5 and the cleaning liquid nozzles 16 may supply the cleaning liquid into the process tank 2 and the chamber 3, respectively. This achieves reduction in time for supplying the cleaning liquid.

Moreover, in the third embodiment, the jet tubes 5 and the cleaning liquid nozzles 16 may supply the rinse liquid into the process tank 2 and the chamber 3, respectively.

Figure 11:
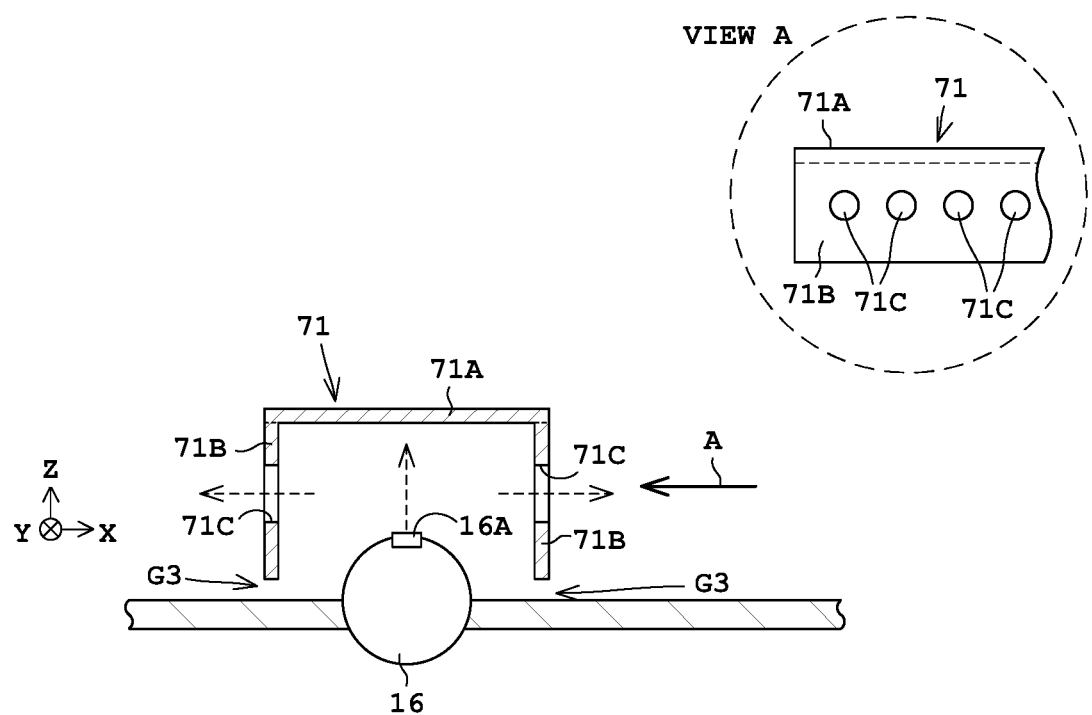
FIG. 11 illustrates a chamber provided with a nozzle cover according to one modification.

(4) In the first embodiment and the modifications (2) and (3) described above, the cleaning liquid nozzles 16 supply the cleaning liquid (e.g., pure water) into the chamber 3 with no shielding. In this regard, as shown in FIG. 11, a nozzle cover 71 for covering the cleaning liquid nozzle 16 may be provided at the bottom within the chamber 3 so as to face an upward ejection port 16A of the cleaning liquid nozzle 16. The nozzle cover 71 may be attached to the bottom within the chamber 3.

The nozzle cover 71 is opened at its lower face, and is a box-shaped member. The nozzle cover 71 includes a ceiling wall 71A and a plurality of (e.g., two or four) side walls 71B connected to the ceiling wall 71A. The ceiling wall 71A has no hole 71C formed therein, but the side walls 71B each have a hole 71C through which the cleaning liquid passes. The side walls 71B are formed so as to extend longitudinally in the Y-direction. The hole 71C has a dimension larger than the ejection port 16A.

The ejection port of the cleaning liquid nozzle 16 is directed upward, for example. The cleaning liquid ejected upward is shielded by the ceiling wall 71A, but is supplied outside of the nozzle cover 71 through the holes 71C of the side walls 71B. When the chamber 3 is decompressed, the cleaning liquid nozzle 16 is likely to be a generating source of mist. Accordingly, the nozzle cover 71 is arranged so as to face the ejection port 16A of the cleaning liquid nozzle 16. Consequently, the mist generated around the cleaning liquid nozzle 16 can be held with the nozzle cover 71, achieving storage of the cleaning liquid in the chamber 3 while mist diffusion is suppressed. Moreover, the cleaning liquid passes through the hole 71C of the side wall 71B, achieving suppressed force of flow of the cleaning liquid.

Here, a gap G3 may be formed between the nozzle cover 71 and the bottom face of the chamber 3 for not blocking the flow at the bottom face of the chamber 3.

Figure 12:
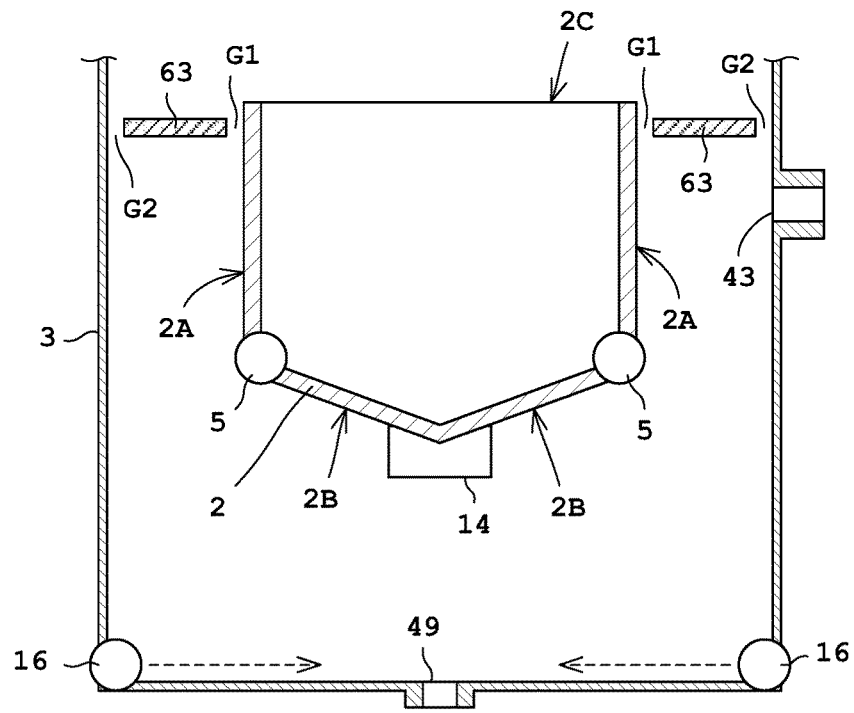
FIG. 12 illustrates a chamber provided with two cleaning liquid nozzles according to another modification.

(5) In the first embodiment and the modifications (2) to (4) described above, the two cleaning liquid nozzles 16 are each provided at the bottom within the chamber 3 at a position overlapping the process tank 2 in plan view. In this regard, as shown in FIG. 12, the two cleaning liquid nozzles 16 may each be provided at a lower corner of the chamber 3. The cleaning liquid nozzles 16 each provided at the corner may have an ejection port directed laterally. Accordingly, the cleaning liquid is emitted laterally from the cleaning liquid nozzles 16.

Figure 13:
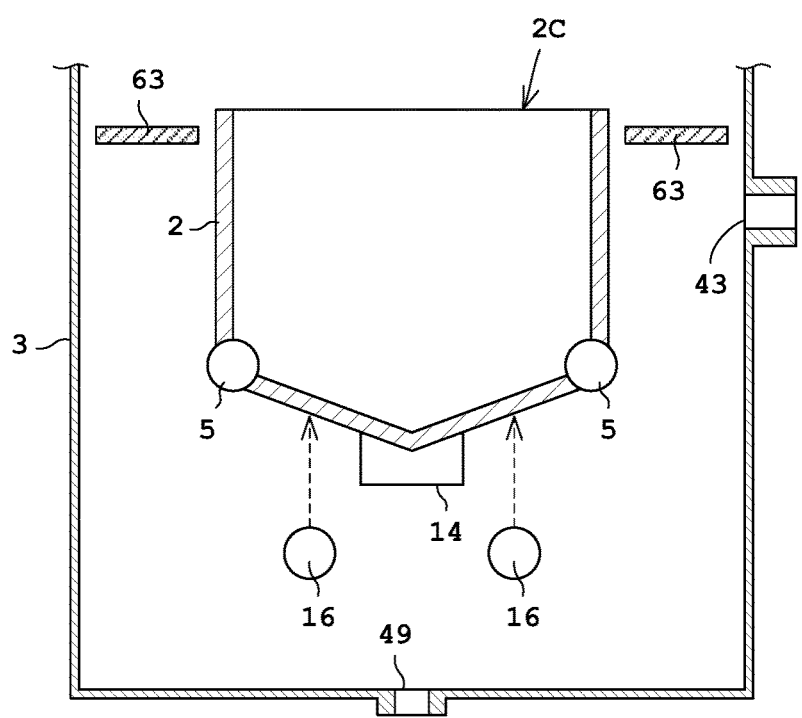
FIG. 13 illustrates a chamber provided with two cleaning liquid nozzles according to another modification.

(6) In the first embodiment and the modifications (2) to (4) described above, the two cleaning liquid nozzles 16 are each provided at the bottom of the chamber 3 or in the bottom face within the chamber 3. In this regard, as shown in FIG. 13, the two cleaning liquid nozzles 16 may each be provided apart from the bottom face within the chamber 3. Moreover, the two cleaning liquid nozzles 16 may each be provided at the inner wall of the chamber 3 positioned lower than the shield plate 63 and higher than the bottom face within the chamber 3. That is, the two cleaning liquid nozzles 16 may each be provided at a lower part within the chamber 3. Here, the cleaning liquid nozzles 16 are each located in a posture so as to be directed toward the outer wall of the process tank 2.

Moreover, the controller 81 may cause the cleaning liquid nozzles 16 to supply the cleaning liquid into the chamber 3 while hitting the outer wall of the process tank 2 with the cleaning liquid in a state where the chamber 3 is decompressed with the air pump. Since the liquid flows on the bottom face of the chamber 3, particles are relatively unlikely to accumulate on the bottom face of the chamber 3. On the other hand, since the outer wall of the process tank 2 is part, for example, where the liquid does not flow easily even if suspended particles adhere thereto, the particles accumulate. Then, the cleaning liquid is stored in the chamber 3 while hitting the part, leading to easy removal of the particles adhered to the outer wall of the process tank 2.

(7) In the embodiments and modifications described above, the substrate treating apparatus 1 includes the two air pumps 47, 57. In this regard, the substrate treating apparatus 1 may include no air pump 57, for example. That is, the air pump 47 may exhaust gas within the chamber 3 through the exhaust pipe 45 while exhausting gas within the drain tank 53 through the exhaust pipe 55.

For example, the on-off valve V7 is configured to allow control of a flow rate of gas passing through the exhaust pipe 45. Moreover, the on-off valve V9 is configured to allow control of a flow rate of gas passing through the exhaust pipe 55. Then, the controller 81 causes the two on-off valves V7, V9 to operate, thereby controlling a flow rate of gas passing through the two exhaust pipes 45, 55. This makes the pressure value P2 within the drain tank 53 smaller than the pressure value P1 within the chamber 3.

(8) In the embodiments and modifications described above, description is made that the particles swirl at the lower part within the chamber 3 when nitrogen gas is supplied to return pressure of the chamber 3 to atmospheric pressure (steps S17, S34, S53). In this regard, particles may swirl in the steps S12, S28, S48, for example.

(9) In the embodiments and modifications described above, the water-repellent vapor is supplied to make the substrate W water-repellent in the step S06 shown in FIG. 2, for example. In this regard, when there is no need to make the substrate W water-repellent, the step S06 for supplying the water-repellent vapor and the steps in connection thereto may be omitted. The same is applicable to the step S26 in FIG. 6 and the step S46 in FIG. 9.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate, comprising:
   a process tank configured to store a treatment liquid;
   a chamber configured to surround the process tank;
   a solvent vapor nozzle configured to supply solvent vapor into the chamber;
   a water-repellent vapor nozzle configured to supply water-repellent vapor into the chamber;

a cleaning liquid nozzle configured to supply a cleaning liquid into the chamber so as to be stored in the chamber; and a controller, the controller causing immersion treatment, wherein a substrate is immersed and processed in the treatment liquid stored in the process tank, to be performed for a preset period of time, and causing dry treatment, wherein the substrate after being processed with the treatment liquid and taken out of the process tank is dried with the solvent vapor supplied from the solvent vapor nozzle, to be performed, the controller causing the cleaning liquid nozzle to supply the cleaning liquid into the chamber, and causing the process tank to be immersed in the cleaning liquid supplied from the cleaning liquid nozzle and stored in the chamber, thereby causing chamber cleaning treatment, wherein the chamber including an outer wall of the process tank is cleaned, to be performed, the controller causing the chamber cleaning treatment to be performed after the immersion treatment, the controller causing the dry treatment to be performed after the chamber cleaning treatment, the controller causing water-repellent vapor supply treatment, wherein the water-repellent vapor is supplied through the water-repellent vapor nozzle into the chamber for making the substrate water-repellent, to be performed after the immersion treatment, and the controller causing the chamber cleaning treatment to be performed after the water-repellent vapor supply treatment.

2. The substrate treating apparatus according to claim 1, further comprising:

an air pump configured to exhaust gas from the chamber, wherein the cleaning liquid nozzle is located at a lower part of the chamber for supplying the cleaning liquid into the chamber, and the controller causes the chamber cleaning treatment to be performed in a state where the chamber is decompressed with the air pump.

3. The substrate treating apparatus according to claim 2, wherein the air pump is configured to exhaust gas from the chamber via an exhaust port provided in a side wall of the chamber laterally of the process tank, and the controller causes the chamber cleaning treatment to be performed in a state where the chamber is decompressed while gas is exhausted from the chamber with the air pump.

4. The substrate treating apparatus according to claim 2, further comprising:

a shield plate provided between the outer wall of the process tank and an inner wall of the chamber for shielding an atmosphere between an upper part of the chamber and the lower part of the chamber, and having an opening through which part of a treatment liquid, flowing out of the process tank, passes to the lower part of the chamber.

5. The substrate treating apparatus according to claim 2, wherein the cleaning liquid nozzle is located at a bottom of the chamber at a position overlapping the process tank in plan view.

6. The substrate treating apparatus according to claim 2, wherein the controller causes the chamber cleaning treatment to be performed when the solvent vapor nozzle supplies the solvent vapor into the chamber.

7. The substrate treating apparatus according to claim 2, wherein the controller causes exhaust treatment, wherein the cleaning liquid is exhausted from an outlet in the chamber, to be performed in a state where the chamber is decompressed with the air pump, and the controller causes the chamber cleaning treatment and the exhaust treatment to be repeated at a preset number of times.

8. The substrate treating apparatus according to claim 2, further comprising:

an inert gas nozzle configured to supply inert gas into the chamber, wherein the controller causes the inert gas nozzle to supply the inert gas into the chamber after the dry treatment to return pressure of the decompressed chamber to atmospheric pressure.

9. The substrate treating apparatus according to claim 2, wherein the cleaning liquid nozzle is located in a posture toward the outer wall of the process tank, and the controller causes the cleaning liquid nozzle to supply the cleaning liquid into the chamber while the cleaning liquid hits the outer wall of the process tank in a state where the chamber is decompressed with the air pump.

10. The substrate treating apparatus according to claim 2, further comprising:

a nozzle cover provided at a bottom in the chamber to face an upward ejection port of the cleaning liquid nozzle, wherein the nozzle cover includes a ceiling wall, and a plurality of side walls connected to the ceiling wall and formed with holes through which the cleaning liquid passes.

* * * * *